(12) United States Patent
Nakazawa et al.

(10) Patent No.: US 7,838,904 B2
(45) Date of Patent: Nov. 23, 2010

(54) NITRIDE BASED SEMICONDUCTOR DEVICE WITH CONCAVE GATE REGION

(75) Inventors: Kazushi Nakazawa, Osaka (JP); Satoshi Nakazawa, Osaka (JP); Tetsuzo Ueda, Osaka (JP); Tsuyoshi Tanaka, Osaka (JP); Masahiro Hikita, Hyogo (JP)

(73) Assignee: Panasonic Corporation, Osaka (JP)

( * ) Notice: Subject to any disclaimer, the term of this patent is extended or adjusted under 35 U.S.C. 154(b) by 287 days.

(21) Appl. No.: 12/023,461

(22) Filed: Jan. 31, 2008

(65) Prior Publication Data
US 2008/0179694 A1 Jul. 31, 2008

(30) Foreign Application Priority Data
Jan. 31, 2007 (JP) ............................ 2007-020509
Dec. 3, 2007 (JP) ............................ 2007-312701

(51) Int. Cl.
*H01L 29/778* (2006.01)
(52) U.S. Cl. ............................... 257/194; 257/E29.246
(58) Field of Classification Search ................. 257/194, 257/E29.246
See application file for complete search history.

(56) References Cited
U.S. PATENT DOCUMENTS
6,787,820 B2 * 9/2004 Inoue et al. ................. 257/192

| 7,038,252 | B2 | 5/2006 | Saito et al. |
| 2005/0051796 | A1 * | 3/2005 | Parikh et al. ................ 257/192 |
| 2005/0139838 | A1 | 6/2005 | Murata et al. |
| 2005/0189559 | A1 * | 9/2005 | Saito et al. ................ 257/189 |
| 2006/0060871 | A1 * | 3/2006 | Beach ........................ 257/94 |
| 2006/0273347 | A1 | 12/2006 | Hikita et al. |
| 2009/0121775 | A1 | 5/2009 | Ueda et al. |

FOREIGN PATENT DOCUMENTS

| JP | 11-261053 | 9/1999 |
| JP | 2002-359256 | 12/2002 |
| JP | 2004-200248 | 7/2004 |
| JP | 2004-273486 | 9/2004 |
| JP | 2005-210105 | 8/2005 |

* cited by examiner

*Primary Examiner*—Jerome Jackson, Jr.
*Assistant Examiner*—Paul A Budd
(74) *Attorney, Agent, or Firm*—McDermott Will & Emery LLP

(57) ABSTRACT

In FET, a second nitride semiconductor layer is provided on a first nitride semiconductor layer, and a source electrode and a drain electrode are each provided to have at least a portion thereof in contact with the second nitride semiconductor layer. A concave portion is formed in the upper surface of the second nitride semiconductor layer to be located between the source electrode and the drain electrode. A gate electrode is provided over the concave portion to cover the opening of the concave portion.

4 Claims, 15 Drawing Sheets

NITRIDE BASED SEMICONDUCTOR DEVICE WITH CONCAVE GATE REGION

BACKGROUND OF THE INVENTION

The present invention relates to a semiconductor device and a method for fabricating the same and, more particularly, to a semiconductor device having a nitride-based compound semiconductor layer and a method for fabricating the same.

A Group III nitride-based compound semiconductor (hereinafter referred to as "Group III nitride semiconductor") represented by gallium nitride (GaN) shows a breakdown field and a saturation electron velocity which are higher than those shown by silicon (Si) and gallium arsenide (GaAs). Therefore, a field effect transistor (hereinafter abbreviated as "FET") using a group III nitride semiconductor is regarded as promising as a next-generation high-frequency device or high-power switching device and has been widely investigated.

In general, high-density trap states (surface states) exist at a surface of a group III nitride semiconductor so that carriers are trapped. Because of this, when a switching device, e.g., is produced by using a group III nitride semiconductor, the carriers trapped by the trap states cannot follow switching during high-speed switching. As a result, a phenomenon in which a drain current decreases, i.e., so-called current collapse occurs. As a method for suppressing the occurrence of the current collapse, the following solution has been known.

For example, as shown in FIG. 22, in Japanese Laid-Open Patent Publication No. 2002-359256, a GaN-based passivation layer 904 is provided on the upper surface of a carrier supply layer 903, and a passivation film 905 made of silicon nitride (SiN) covers the respective surface portions of the GaN-based passivation layer 904 located between a gate electrode 906 and a source electrode 907 and between the gate electrode 906 and a drain electrode 907. The arrangement allows a reduction in trap states at a group III nitride semiconductor. In FIG. 22, 901 denotes a substrate and 902 denotes a carrier transport layer.

On the other hand, it is disclosed in Japanese Laid-Open Patent Publication No. 2004-200248 that the upper surface of a Group III nitride semiconductor is covered with a silicon nitride film and a field plate electrode.

It is also disclosed in Japanese Laid-Open Patent Publication No. 2005-210105 that a recess is formed in the portion of a group III nitride semiconductor layer located under a gate electrode to provide a spike gate electrode, whereby frequency dispersion is suppressed.

SUMMARY OF THE INVENTION

Of the technologies disclosed in Japanese Laid-Open Patent Publication Nos. 2002-359256, 2004-200248, and 2005-210105, the one disclosed in Japanese Laid-Open Patent Publication No. 2005-210105 is preferably used, because this allows effective suppression of the influence of the trap states. However, because Japanese Laid-Open Patent Publication No. 2005-210105 does not disclose a specific problem solving method, it is difficult to fabricate a semiconductor device having a group III nitride semiconductor reproducibly.

By contrast, in a semiconductor device according to the present invention, the occurrence of the current collapse can be suppressed with excellent reproducibility, which will be shown specifically hereinbelow.

The semiconductor device according to the present invention comprises: a substrate; a semiconductor multilayer; a source electrode; a drain electrode; a gate electrode; and a concave portion. The semiconductor multilayer has a first nitride-based compound semiconductor layer and a second nitride-based compound semiconductor layer. The first nitride-based compound semiconductor layer is provided over the substrate and the second nitride-based compound semiconductor layer is provided over the first nitride-based compound semiconductor layer. The second nitride-based compound semiconductor layer has a band gap larger than that of the first nitride-based compound semiconductor layer. The source electrode and the drain electrode are each provided to have at least a portion thereof in contact with the semiconductor multilayer. The concave portion is provided on an upper surface of the semiconductor multilayer to be located between the source electrode and the drain electrode, and is concaved in a thickness direction of the semiconductor multilayer. The gate electrode is provided over the concave portion to cover an opening of the concave portion.

In the structure described above, when the semiconductor device is in an OFF state, the influence exerted by a depletion layer resulting from surface states on a channel can be suppressed, and the occurrence of the current collapse can be suppressed.

In the semiconductor device according to the present invention, a difference $\Delta Vp$ between the threshold voltages preferably satisfies $\Delta Vp = Vp1 - Vp2 \geq 2.5$ V, wherein Vp1 is a threshold voltage of a transistor having a gate electrode formed in contact with a bottom surface of the concave portion and Vp2 is a threshold voltage of a transistor having a gate electrode formed in contact with the upper surface of the semiconductor multilayer. This allows effective suppression of the occurrence of the current collapse.

In the semiconductor device according to the present invention, a depth of the concave portion is preferably not less than 15 nm.

In the semiconductor device according to the present invention, the semiconductor multilayer may further have an n-type nitride-based compound semiconductor layer provided as an uppermost layer over the second nitride-based compound semiconductor layer. In this case, at least one of a portion of the n-type nitride-based compound semiconductor layer located between the gate electrode and the source electrode and a portion of the n-type nitride-based compound semiconductor layer located between the gate electrode and the drain electrode is preferably removed. This allows a reduction in leakage current flowing via the n-type nitride-based compound semiconductor layer.

In the semiconductor device according to the present invention, each of the source electrode and the drain electrode preferably has a portion thereof in contact with the first nitride-based compound semiconductor layer. This allows a reduction in the ohmic contact resistance of each of the source electrode and the drain electrode.

In the semiconductor layer according to the present invention, the second nitride-based compound semiconductor layer preferably includes a nitride-based compound semiconductor layer having a band gap larger than that of the second nitride-based compound semiconductor layer. As a result, the nitride-based compound semiconductor layer having the band gap larger than that of the second nitride-based compound semiconductor layer functions as an etching stop layer, and it becomes possible to control the depth of the concave portion with excellent reproducibility.

In a preferred embodiment described later, the gate electrode is in contact with a bottom surface of the concave portion and with a portion of the upper surface of the semiconductor multilayer.

In this case, the semiconductor device according to the present invention preferably further comprises: an insulating film in contact with a portion of the upper surface of the semiconductor multilayer and opened to expose the concave portion, wherein the gate electrode preferably has a portion thereof provided over the insulating film. This allows a reduction in the surface states present at the upper surface of the semiconductor multilayer. In addition, when the opening in the insulating film is larger in size than the opening of the concave portion in the vicinity of the opening of the concave portion, the production yield of the semiconductor device can be improved.

Preferably, the semiconductor device according to the present invention further comprises: a second insulating film provided between the gate electrode and a bottom surface of the concave portion. This allows an improvement in the adhesion of the gate electrode to the bottom surface of the concave portion.

Preferably, the semiconductor device according to the present invention further comprises: a third insulating film in contact with the concave portion and with a portion of the upper surface of the semiconductor multilayer, wherein the gate electrode is in contact with an upper surface of the third insulating film. This allows a reduction in gate leakage current.

The semiconductor device according to the present invention may further comprise: a fourth insulating film provided to be in contact with a bottom surface of the concave portion and located between the gate electrode and the insulating film.

Preferably, a length of an extended portion of the gate electrode located over the semiconductor multilayer is larger on a side with the drain electrode than on a side with the source electrode. This allows a reduction in the localization of an electric field between the gate electrode and the drain electrode.

In another preferred embodiment described later, the semiconductor device according to the present invention further comprises: a p-type nitride-based compound semiconductor layer provided to cover the opening of the concave portion and to be located between the gate electrode and the semiconductor multilayer, wherein the p-type nitride-based compound semiconductor works as a part of a terminal for controlling a current between the source and the drain by applying a voltage. As a result, it is possible to not only suppress the occurrence of the current collapse, but also implement a normally-OFF operation.

In this case, an impurity concentration in an outermost surface layer of the p-type nitride-based compound semiconductor layer is preferably higher than an impurity concentration in the portion of the p-type nitride-based compound semiconductor layer other than the outermost surface layer. This allows a reduction in gate resistance.

In addition, a film thickness of a portion of the p-type nitride-based compound semiconductor layer located over a bottom surface of the concave portion is preferably larger than a film thickness of a portion of the p-type nitride-based compound semiconductor layer located on the upper surface of the semiconductor multilayer. This makes it possible to reduce the surface states present at the surface of the semiconductor multilayer and further suppress the current collapse.

A first method for fabricating a semiconductor device according to the present invention comprises: (a) growing a first nitride-based compound semiconductor layer and a grown layer composed of a second nitride-based compound semiconductor layer over a substrate; (b) providing a mask on a portion of an upper surface of the grown layer; (c) after the step (b), re-growing the grown layer to form the second nitride-based compound semiconductor layer having a concave portion with a bottom surface composed of the portion of the grown layer where the mask is formed on the first nitride-based compound semiconductor layer; and (d) forming a source electrode and a drain electrode such that each of the source electrode and the drain electrode has a portion thereof in contact with the second nitride-based compound semiconductor layer and forming a gate electrode so as to cover an opening of the concave portion.

A second method for fabricating a semiconductor device according to the present invention comprises: (e) growing a first nitride-based compound semiconductor layer and a second nitride-based compound semiconductor layer over a substrate; (f) forming a concave portion in an upper surface of the second nitride-based compound semiconductor layer; (g) after the step (f), growing a p-type nitride-based compound semiconductor layer to cover an opening of the concave portion; and (h) forming a source electrode and a drain electrode such that each of the source electrode and the drain electrode has a portion thereof in contact with the second nitride-based compound semiconductor layer and forming a gate electrode over the p-type nitride-based compound semiconductor layer.

DESCRIPTION OF THE PREFERRED EMBODIMENTS

Figure 1:
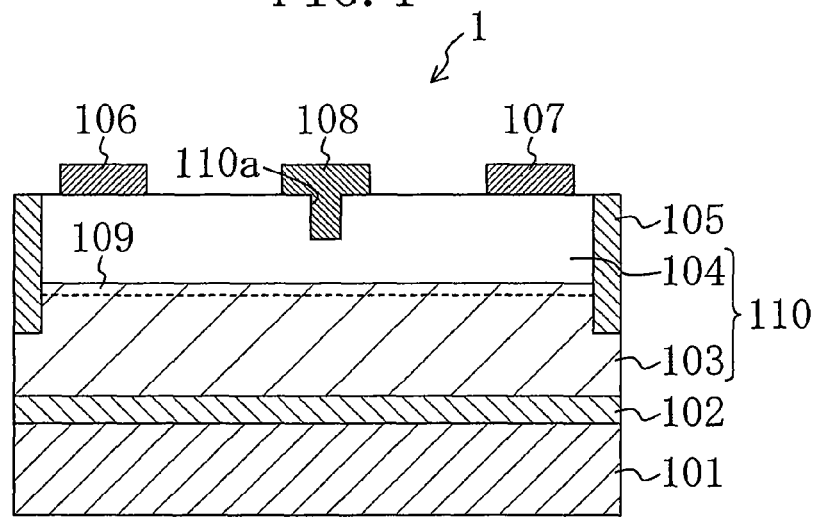
FIG. 1 is a cross-sectional view showing a structure of a FET according to a first embodiment of the present invention.

Referring now to the drawings, the embodiments of the present invention will be described hereinbelow in detail. Although a field effect transistor (FET) is described as an example of a semiconductor device in each of the following embodiments, the present invention is not limited to the following embodiments. In the following embodiments, substantially the same components are denoted by the same reference numerals, and repeated description thereof may thus be omitted.

Embodiment 1

FIG. 1 is a cross-sectional view showing a structure of a FET 1 according to the first embodiment of the present invention.

The FET 1 according to the present embodiment comprises: a substrate 101; a buffer layer 102; a first nitride semiconductor layer (first nitride-based compound semiconductor) 103; a second nitride semiconductor layer (second nitride-based compound semiconductor layer) 104; isolation regions 105; a source electrode 106; a drain electrode 107; and a gate electrode 108. In the second nitride semiconductor layer 104, a concave portion 110a is formed to be concaved in the thickness direction of the second nitride semiconductor layer 104.

Specifically, as shown in FIG. 1, the buffer layer 102, the first nitride semiconductor layer 103, and the second nitride semiconductor layer 104 are successively stacked on the substrate 101. The first nitride semiconductor layer 103 and the second nitride semiconductor layer 104 constitute a semiconductor multilayer 110. A heterojunction is formed between the second nitride semiconductor layer 104 and the first nitride semiconductor layer 103. As a result, a two-dimensional electron gas layer 109 is formed in the vicinity of the upper surface of the first nitride semiconductor layer 103. The isolation regions 105 are formed on the side surfaces of the semiconductor multilayer 110. A source electrode 106 and a drain electrode 107 are provided on the upper surface of the second nitride semiconductor layer 104 to have the concave portion 110a interposed therebetween. A gate electrode 108 is provided on the upper surface of the second nitride semiconductor layer 104 so as to cover the opening of the concave portion 110a, and is also buried in the concave portion 110a. Thus, since the FET 1 according to the present embodiment has a recessed gate structure, it is possible to reduce the influence exerted by surface states present at the surface of the second nitride semiconductor layer 104 on a channel, and suppress the occurrence of current collapse.

The specific materials of the semiconductor layers constituting the FET 1 according to the present embodiment and the like will be shown hereinbelow. The substrate 101 is preferably a sapphire substrate, but it is also possible to use a SiC substrate, a Si substrate, a GaN substrate, or the like for the substrate 101. The buffer layer 102 is a layer made of, e.g., aluminum nitride (AlN). Preferably, the second nitride semiconductor layer 104 contains Al. In an example of the combination of the first nitride semiconductor layer 103 and the second nitride semiconductor layer 104, the first nitride semiconductor layer 103 is an undoped GaN layer and the second nitride semiconductor layer 104 is an undoped $Al_{0.25}GaN$ layer. The first and second nitride semiconductor layers 103 and 104 need not be undoped layers. An Al composition in an AlGaN layer (second nitride semiconductor layer 104) may also be varied in the thickness direction. For example, the second nitride semiconductor layer 104 may be formed such that the Al composition value gradually increases from the interface with the first nitride semiconductor layer 103 with approach toward the upper surface of the second nitride semiconductor layer 104. Otherwise, the second nitride semiconductor layer 104 may also obtained by stacking two or more semiconductor layers having different Al composition values. In another example of the combination, both of the first and second nitride semiconductor layers 103 and 104 are AlGaN layers, and the composition ratio of Al is higher in the second nitride semiconductor layer 104 than in the first nitride semiconductor layer 103. It is also possible for each of the first and second nitride semiconductor layers 103 and 104 to contain In. The wording "undoped" means that intentional doping with an impurity is not performed during growth. It is sufficient for the isolation regions 105 to be higher in resistance than the portion other than the isolation regions 105. For example, the isolation regions 105 are formed by the implantation of an impurity such as boron (B). Each of the source electrode 106 and the drain electrode 107 preferably has a multilayer structure of titanium (Ti) and aluminum (Al). The gate electrode 108 is preferably made of a metal capable of forming a Schottky junction with the second nitride semiconductor layer 104, such as palladium (Pd), nickel (Ni), or platinum (Pt) having a large work function.

The specific layer thicknesses of the substrate 101 constituting the FET 1 according to the present embodiment and the like will be shown below. The thickness of the substrate 101 is preferably not less than 10 μm and not more than 1000 μm, and is, e.g., 450 μm. The thickness of the buffer layer 102 is preferably not less than 10 nm and not more than 500 nm, and is, e.g., 100 nm. The thickness of the first nitride semiconductor layer 103 is preferably not less than 0.01 μm and not more than 8 μm, and is, e.g., 2 μm. The thickness of the second nitride semiconductor layer 104 is preferably not less than 1 nm and not more than 100 nm, and is, e.g., 45 nm.

Figure 2A:
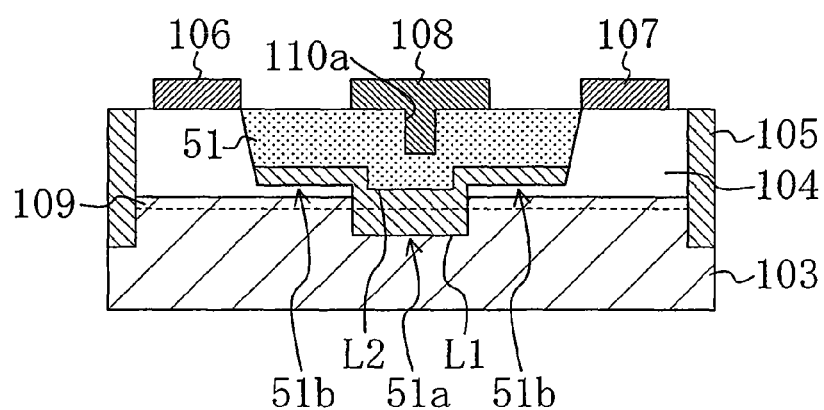
FIG. 2A is a view schematically showing a transistor operation in the FET according to the first embodiment and FIG. 2B is a view schematically showing a transistor operation in a FET according to a conventional embodiment.
Figure 2B:
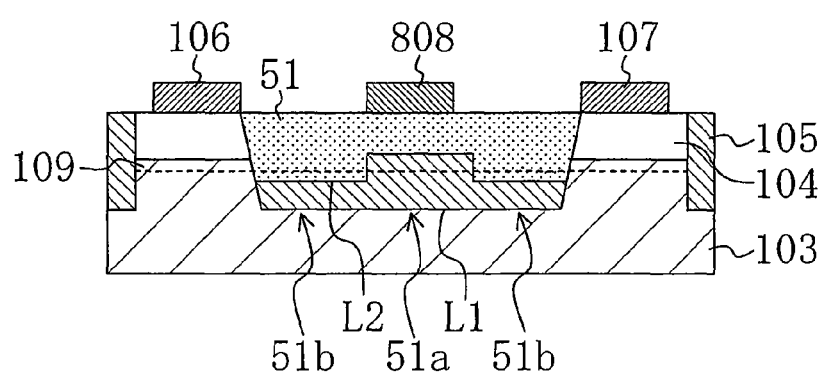

The current collapse indicates a state in which, when carriers are trapped by surface states present at a surface of a nitride semiconductor layer and remain trapped for a long time, a drain current decreases upon switching of a transistor from the OFF state to the ON state. A description will be given hereinbelow to the cause of the occurrence of the current collapse in a FET with reference to FIGS. 2A and 2B. FIG. 2A is a view schematically showing a depletion layer 51 in the FET 1 according to the present embodiment. FIG. 2B is a view schematically showing the depletion layer 51 in a FET (hereinafter referred to as the "conventional FET") which does not have a recessed gate structure.

The following is a conceived cause of the occurrence of the current collapse. In general, in a FET having a heterojunction surface such as the FET 1 according to the present embodiment, when a voltage is applied to the drain electrode, carriers flow in the two-dimensional electron gas layer present in the vicinity of the heterojunction, resulting in a drain current. In a FET having a nitride semiconductor layer, a surface state density at a surface of the nitride semiconductor layer is high, and a depletion layer (depletion layer resulting from surface states) is formed due to the high surface state density. When the depletion layer reaches the two-dimensional electron gas layer, the resistance of the two-dimensional electron gas layer becomes high so that a drain current decreases to cause the current collapse.

The depletion layer resulting from surface states is present on a side of a gate electrode. In FIGS. 2A and 2B, the depletion layer 51 is also present under the gate electrode 108, but the depletion layer present under the gate electrode 108 is a depletion layer 51a (depletion layer resulting from a Schottky junction) which results from the Schottky junction between the gate electrode 108 and the second nitride semiconductor layer 104. In contrast to the depletion layer 51a resulting from a Schottky junction which changes in accordance with a gate voltage (specifically, it contracts when a positive gate voltage is applied), the depletion layer 51b resulting from surface states is less likely to change in response to the gate voltage (specifically, it does not contracts so greatly even when the gate voltage is applied). As a result, when the FET is switched from the OFF state to the ON state, the depletion layer 51a resulting from a Schottky junction contracts more significantly than the depletion layer 51b resulting from surface states, so that the lower surface of the depletion layer 51 changes from L1 to L2.

Specifically, when the conventional FET is in the OFF state as shown in FIG. 2B, each of the depletion layer 51a resulting from a Schottky junction and the depletion layer 51b resulting from surface states is present extensively in the two-dimensional electron gas layer 109. When the conventional FET is switched from the OFF state to the ON state, the depletion layer 51a resulting from a Schottky junction contracts more significantly than the depletion layer 51b resulting from surface states, as described above. As a result, the depletion layer 51a resulting from a Schottky layer is present above the two-dimensional electron gas layer 109, while the depletion layer 51b resulting from surface states is partly present inside the two-dimensional electron gas layer 109. Accordingly, the resistance of the two-dimensional electron gas layer 109 becomes high so that the current collapse occurs.

By contrast, in the FET 1 according to the present embodiment, the concave portion 110a is formed in the second nitride semiconductor layer 104. Since the concave portion 110a is thus formed in the second nitride semiconductor layer 104, the film thickness of the second nitride semiconductor layer 104 is larger than in the conventional FET to increase the distance between the upper surface of the second nitride semiconductor layer 104 and the two-dimensional electron gas layer 109. As a result, even when the FET 1 is in the OFF state, the lower surface of the depletion layer 51b resulting from surface states is located above the two-dimensional electron gas layer 109, as shown in FIG. 2A. Therefore, in the FET 1 according to the present embodiment, the two-dimensional electron gas layer 109 is not affected by the depletion layer resulting from surface states irrespective of whether the FET is in the OFF state or in the ON state. This allows suppression of the occurrence of the current collapse.

Thus, by optimizing the depth of the concave portion 110a, the lower surface of the depletion layer 51a resulting from surface states is located above the two-dimensional electron gas layer 109 when the FET 1 is in the OFF state. As a result, it is possible to suppress the occurrence of the current collapse.

The present inventors have verified by experiment that, when the gate electrode 108 has a recessed structure, the occurrence of the current collapse can be suppressed and optimized the depth of the concave portion 110a.

Figure 3A:
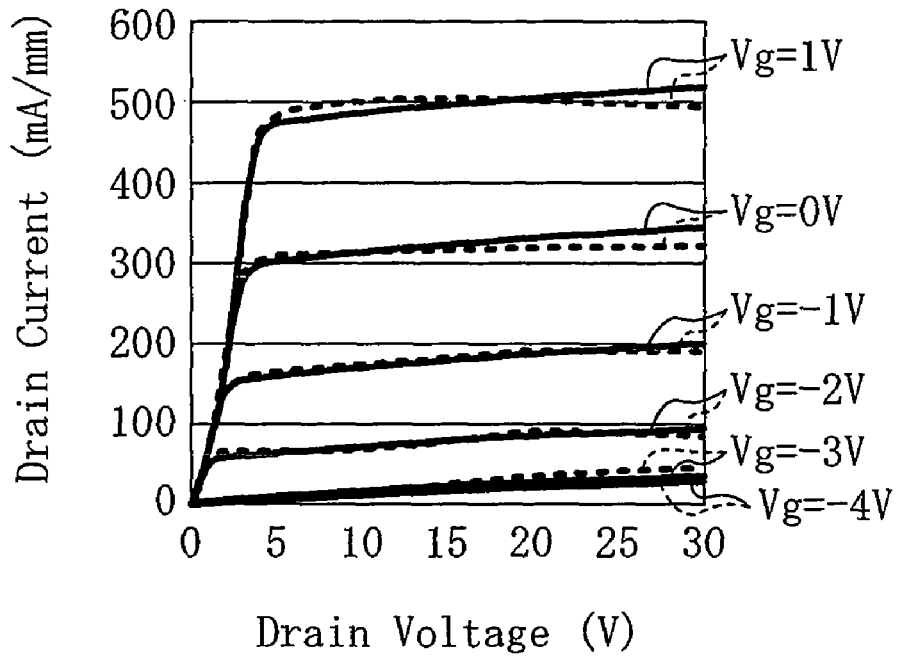
FIG. 3A is a graph showing a drain current flow in the FET according to the first embodiment when a dc voltage and a pulse voltage were applied thereto and FIG. 3B is a graph showing a drain current flow in the FET according to the conventional embodiment when a dc voltage and a pulse voltage were applied thereto.
Figure 3B:
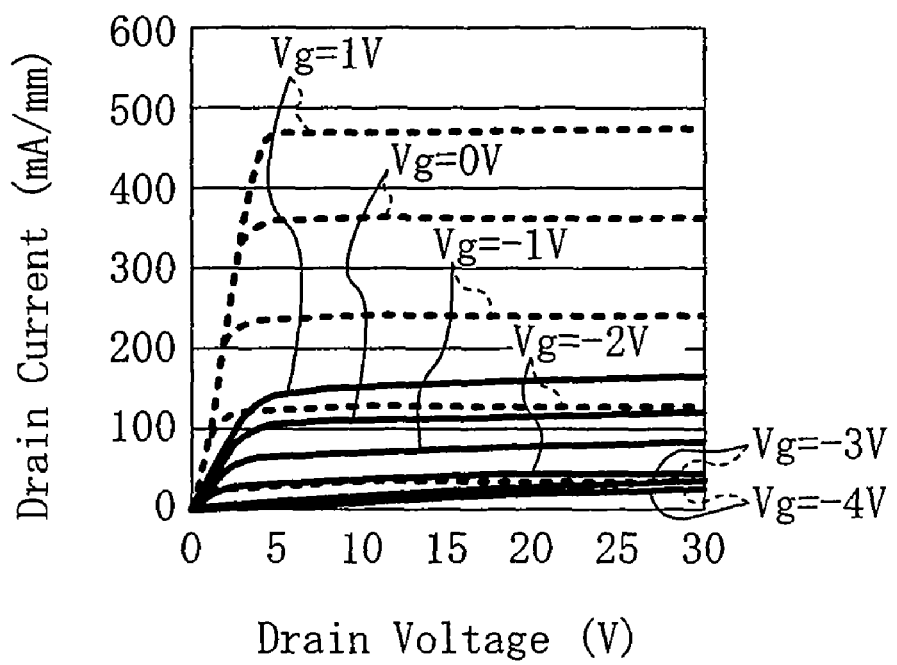

First, the present inventors have verified that, when the gate electrode 108 has a recessed structure, the occurrence of the current collapse can be suppressed. Specifically, the FET 1 according to the present embodiment and the conventional FET were prepared and, by applying a dc voltage and a pulse voltage to each of the FETs, drain currents were measured. In the application of the pulse voltage, a pulse having a pulse width of 0.5 microseconds and a pulse interval of 1 millisecond was used. In the FET 1 according to the present embodiment, the depth of the concave portion 110a was adjusted to be 25 nm. FIG. 3A is a graph showing the drain current flow in the FET 1 according to the present embodiment. FIG. 3B is a graph showing the drain current flow in the conventional FET. In FIGS. 3A and 3B, each of the solid lines shows the result when the pulse voltage was applied, while each of the broken lines shows the result when the dc voltage was applied. As shown in FIGS. 3A and 3B, the gate voltage (Vg) was varied from −4 V to 1 V at 1 V steps.

When the occurrence of the current collapse has been suppressed in the FET, the drain current value (Ids_pulse) obtained by applying the pulse voltage to the FET is generally the same as the drain current value (Ids_0) obtained by applying the dc voltage to the FET. On the other hand, when the current collapse has occurred, the drain current value (Ids_pulse) obtained by applying the pulse voltage to the FET is smaller than the drain current value (Ids_0) obtained by applying the dc voltage to the FET.

As shown in FIG. 3B, in the conventional FET, the drain current (Ids_pulse) flows when the pulse voltage was applied was not more than ⅓ of the drain current (Ids_0) flow when the dc voltage was applied. By contrast, as shown in FIG. 3A, in the FET 1 according to the present embodiment, the drain current (Ids_pulse) flow when the pulse voltage was applied was generally the same as the drain current (Ids_0) flow when the dc voltage was applied. From this, it has been verified that the occurrence of the current collapse can be suppressed when the gate electrode 108 has a recessed structure.

Next, the present inventors have optimized the depth of the concave portion 110a. Specifically, FETs having the respective concave portions 110a at different depths were prepared each by using a GaN layer as the first nitride semiconductor layer 103 and using an $Al_{0.25}GaN$ layer as the second nitride semiconductor layer 104, and the current ratio (Ids_pulse/Ids_0) was measured for each of the FETs. The current ratio (Ids_pulse/Ids_0) is a ratio (Ids_pulse/Ids_0) between a drain current (Ids_pulse) flow when the pulse voltage is applied to the FET and the drain current (Ids_0) flow when the dc voltage is applied to the FET. As the current ratio (Ids_pulse/Ids_0) is closer to 1, it shows that the occurrence of the current collapse is suppressed more completely.

Figure 4:
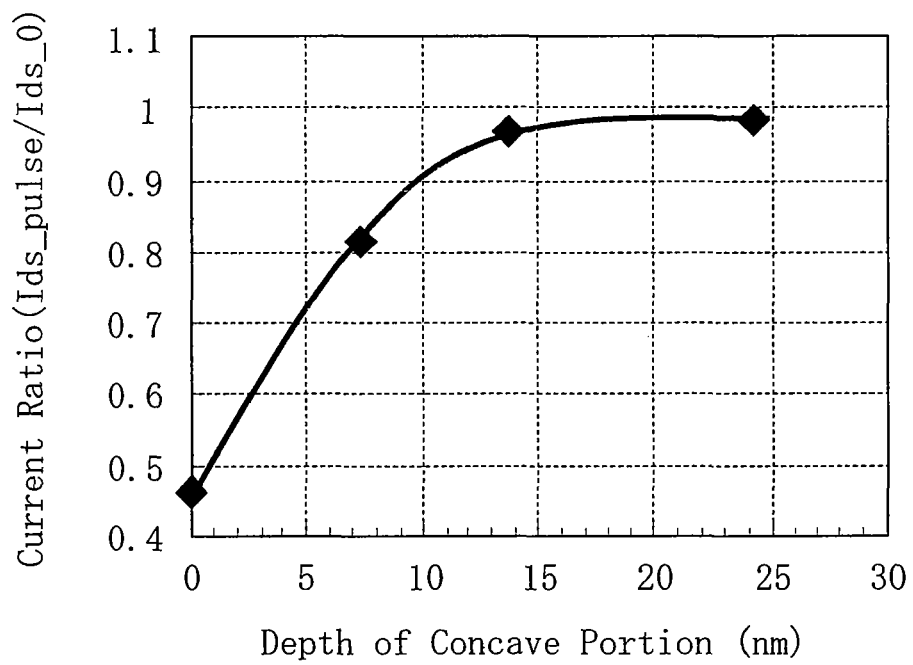
FIG. 4 is a graph showing the result of examining the current ratio (Ids_pulse/Ids_0) relative to the depth of a concave portion for the FET according to the first embodiment.

FIG. 4 shows the result of the measurement. As shown in FIG. 4, when the depth of the concave portion 110a was not less than 15 mm, the occurrence of the current collapse was suppressed successfully. Therefore, to suppress the occurrence of the current collapse, it is sufficient for the depth of the concave portion 110a to be not less than 15 nm. Preferably, the depth of the concave portion 110a is not less than 20 nm and, more preferably, not less than 25 nm.

In the approach described above, a collapse-free configuration has been realized by optimizing the depth of the concave portion 110a. The following is the realization of a collapse-free configuration approached from the viewpoint of the threshold voltage difference ΔVp between the transistors each having the recessed gate electrode 108.

The carrier concentration of a two-dimensional electron gas at an AlGaN/GaN heterojunction resulting from a polarization electric field is increased by increasing the film thickness of the AlGaN layer (second nitride semiconductor layer) as an electron supply layer. In other words, when the film thickness of the second nitride semiconductor layer increases, the threshold voltage shifts in the negative direction. Accordingly, when it is assumed that the threshold voltage of the transistor having the gate electrode formed in contact with the bottom surface of the concave portion is Vp1 and the threshold voltage of the transistor having the gate electrode formed in contact with the upper surface of the semiconductor multilayer is Vp2, Vp1 has a more positive voltage value than Vp2. As the depth of the concave portion 110a is increased, the threshold voltage difference ΔVp=Vp1−Vp2 is larger. The current collapse occurs as a result of the channel closed by a depletion layer resulting from surface states. Therefore, it is possible to hold the channel located sidewise under the gate electrode 108 in a normally-ON state by increasing ΔVp through the formation of the concave portion 110a and to suppress the occurrence of the current collapse by merely controlling the depletion layer located under the bottom surface of the concave portion 110a with the gate electrode 108.

Figure 5:
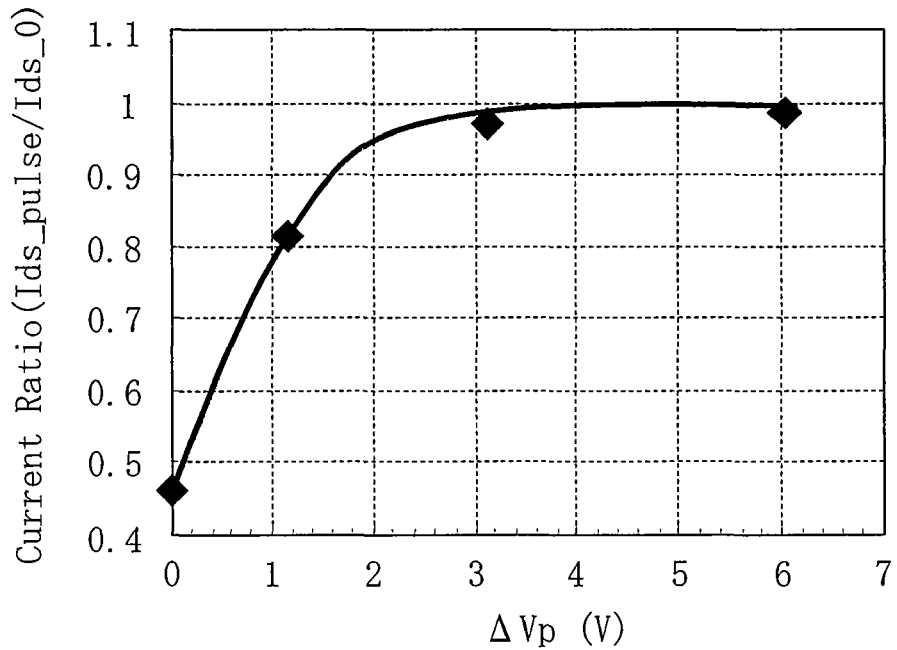
FIG. 5 is a graph showing the result of examining the current ratio (Ids_pulse/Ids_0) relative to a threshold voltage difference $\Delta V_p$ for the FET according to the first embodiment.

The present inventors have also optimized the threshold difference ΔVp. Specifically, FETs having different threshold voltage differences ΔVp were prepared each by using a GaN layer as the first nitride semiconductor layer 103 and using an $Al_{0.25}GaN$ layer as the second nitride semiconductor layer 104, and the current ratio (Ids_pulse/Ids_0) was measured for each of the FETs. FIG. 5 shows the result of the measurement. As shown in FIG. 5, to suppress the occurrence of the current collapse, it is sufficient for ΔVp to be not less than 2.5 V and, preferably, ΔVp is not less than 3 V.

The threshold voltage difference ΔVp can be measured by, e.g., the following two methods. In the first method, prior to the measurement of ΔVp, the composition ratio of Al in the second nitride semiconductor layer 104 of a test transistor Tr0, the thickness of the second nitride semiconductor layer 104 thereof, and the depth of the concave portion 110a thereof are measured. Then, two transistors Tr1 and Tr2 are produced. At this time, the concave portion 110a is not formed in either of the transistors Tr1 and Tr2, and the Al composition ratio in the second nitride semiconductor layer 104 is controlled to be generally the same in each of the transistors Tr0, Tr1, and Tr2. The thickness of the second nitride semiconductor layer 104 of the first transistor Tr1 is assumed to have a value obtained by subtracting the measured depth of the concave portion 111a from the thickness of the second nitride semiconductor layer 104 of the transistor Tr0. The thickness of the second nitride semiconductor layer 104 of the second transistor Tr2 is assumed to be the same as that of the second nitride semiconductor layer 104 of the transistor Tr0. Subsequently, the threshold voltage $Vp_{(Tr1)}$ is measured in the transistor Tr1, and the threshold voltage $Vp_{(Tr2)}$ is measured in the transistor Tr2. Then, by subtracting $Vp_{(Tr2)}$ from $Vp_{(Tr1)}$, ΔVp can be measured.

A threshold voltage is defined as follows. First, a drain voltage is set to an arbitrary value, and the transmission characteristic (variations in drain current (Ids) relative to a gate voltage (Vgs)) of a transistor is measured. Then, a curve is drawn by plotting the square roots (√Ids) of Ids as a Y-axis and plotting Vgs as an X-axis. A tangential line is drawn at the point where the gradient of the curve is maximum, and the value of Vgs at the intersection point between the tangential line and the X-axis (√Ids=0) is assumed to be the threshold voltage.

In the second method, the Al composition ratio in the second nitride semiconductor layer 104, the thickness of the second nitride semiconductor layer 104, and the depth of the concave portion 110a are measured, and Vp1 and Vp2 are calculated using the following expression (1) to obtain ΔVp (=Vp1−Vp2).

$$Vp = \Phi_b - \Delta E_c - (qn_s d)/\in \quad (V) \qquad (1)$$

where $\Phi_b$ is the height of a Schottky barrier, $\Delta E_c$ is a band offset in a conduction band in each of the first nitride semiconductor layer 103 and the second nitride semiconductor layer 104, q is an amount of charge of electrons, $n_s$ is a sheet carrier density due to polarization, d is the thickness of the second nitride semiconductor layer 104, and ∈ is the dielectric constant of the second nitride semiconductor layer 104.

Further, the present inventors have simulated the relationship between the composition ratio of Al in the second nitride semiconductor layer 104 and the depth of the concave portion 110a. Specifically, the depth of the concave portion at which ΔVp becomes not less than 2.5 V when the composition ratio of Al is varied on the assumption that the first nitride semiconductor layer is a GaN layer and the second nitride semiconductor layer is an $Al_xGa_{1-x}N$ layer (0≦x≦1).

Figure 6:
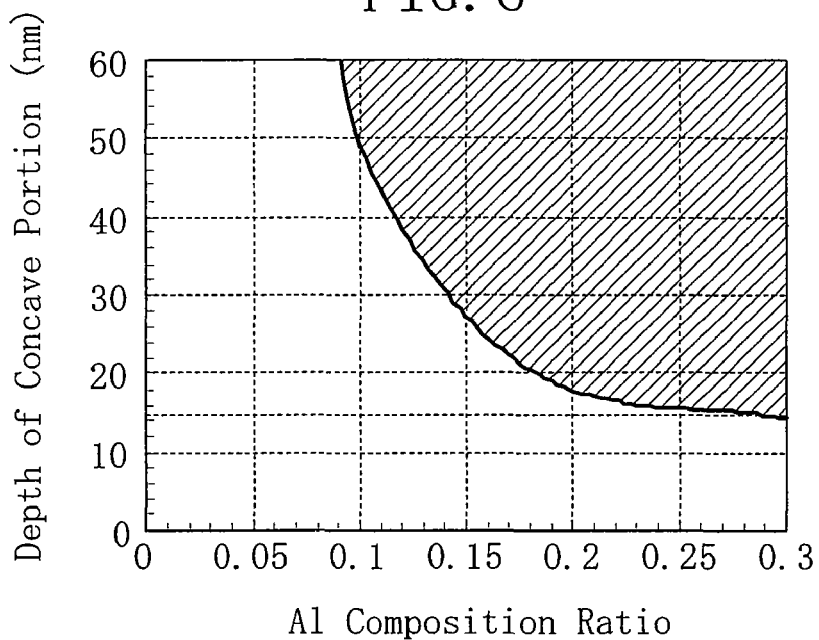
FIG. 6 is a graph showing the result of simulating the current ratio (Ids_pulse/Ids_0) relative to the composition ratio of Al in a second nitride semiconductor layer and to the depth of the concave portion for the FET according to the first embodiment.

FIG. 6 shows the result of the simulation. The hatched region shown in FIG. 6 is a collapse free region (where the occurrence of the current collapse has been suppressed). It can be seen that, as the composition ratio of Al is smaller, the depth of the concave portion should be larger.

Such a FET 1 can be fabricated in accordance with, e.g., a method shown hereinbelow.

First, the buffer layer 102, the first nitride semiconductor layer 103, and the second nitride semiconductor layer 104 are epitaxially grown successively on the surface of the substrate 101 by, e.g., MOCVD (Metal Organic Chemical Vapor Deposition).

Next, by performing dry etching using, e.g., a chlorine ($Cl_2$) gas, the concave portion 110a is formed in the surface of the second nitride semiconductor layer 104.

Subsequently, boron ions, e.g., are implanted to form the isolation regions 105.

Subsequently, by using, e.g., an electron beam deposition method and a lift-off method, the source electrode 106 and the drain electrode 107 are formed on the upper surface of the second nitride semiconductor layer 104. Thereafter, a thermal treatment is performed to form ohmic contacts.

Then, by using, e.g., an electron beam deposition method and a lift-off method, the gate electrode 108 is buried in the concave portion 110a and provided on the upper surface of the second nitride semiconductor layer 104 so as to cover the opening of the concave portion 110a. In this manner, the FET 1 according to the present embodiment can be fabricated.

Embodiment 2

Figure 7:
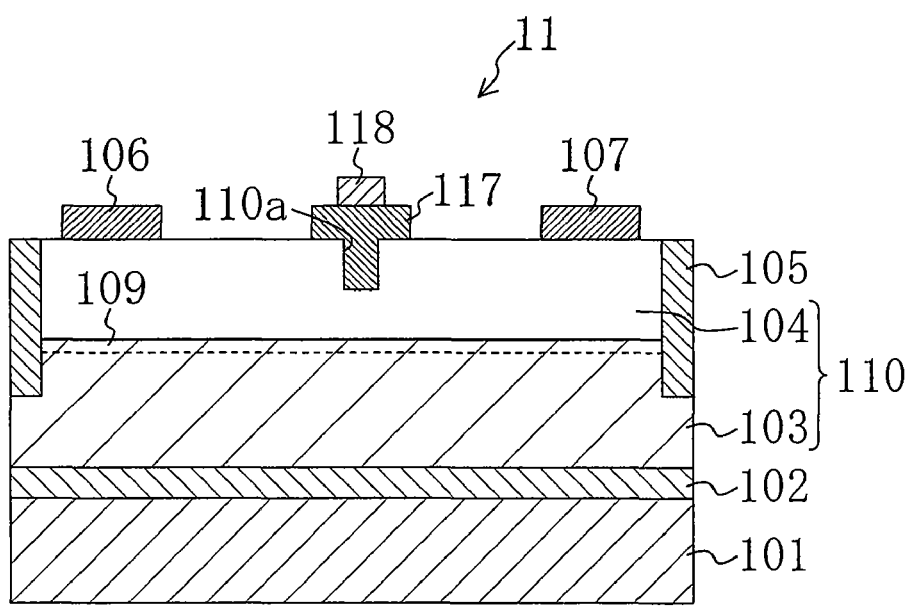
FIG. 7 is a cross-sectional view showing a structure of a FET according to a second embodiment of the present invention.

FIG. 7 is a cross-sectional view showing a structure of a FET 11 according to the second embodiment of the present invention.

The FET 11 according to the present embodiment is different from the FET 1 according to the first embodiment in that a p-type nitride semiconductor layer 117 is provided between the lower surface of a gate electrode 118 and the bottom surface of the concave portion 110a. Specifically, the p-type nitride semiconductor layer 117 is provided in the concave portion 110a and also on the upper surface of the second nitride semiconductor layer 104. In other words, the portion of the p-type nitride semiconductor layer 117 located over the bottom surface of the concave portion 110a is thicker than the portion of the p-type nitride semiconductor layer 117 provided on the upper surface of the second nitride semiconductor layer 104. The gate electrode 118 is provided on the upper surface of the p-type nitride semiconductor layer 117. In such a structure also, a collapse-free FET can be realized provided that the depth of the concave portion is not less than 15 nm, i.e., $\Delta Vp$ is nor less than 2.5 V. As the p-type nitride semiconductor layer 117, a group III nitride semiconductor layer doped with an impurity presenting a p-type conductivity can be used and, e.g., a GaN layer doped with Mg can be used.

The specific materials and thicknesses of the semiconductor layers composing the FET 11 according to the present embodiment are shown below. The p-type nitride semiconductor layer 117 is preferably a semiconductor layer doped with Mg, but it is also possible to use Mg-doped $Al_{0.25}GaN$ in which the composition ratio of Al is equal to the composition ratio in the second nitride semiconductor layer 104 for the p-type nitride semiconductor layer 117. In the p-type nitride semiconductor layer 117, the Al composition ratio is not limited to 0.25, and may also be either constant or different in the thickness direction of the p-type nitride semiconductor layer 117. Otherwise, the p-type nitride semiconductor layer 117 may also be a p-type nitride semiconductor layer not containing Al made of, e.g., Mg-doped GaN. The impurity concentration in the p-type nitride semiconductor layer 117 is preferably not less than $1 \times 10^{18}$ cm$^{-3}$ to suppress the extension of a depletion layer into the p-type nitride semiconductor layer. The thickness of the p-type nitride semiconductor layer 117 is preferably not less than 10 nm and not more than 500 nm, and is, e.g., 100 mm. Such a p-type nitride semiconductor layer 117 functions as a part of a terminal for controlling a current by applying a voltage.

The gate electrode 108 is preferably made of a metal capable of forming an ohmic junction with the p-type nitride semiconductor layer 117, which is preferably a metal having a large work function such as, e.g., palladium (Pd), nickel (Ni), or platinum (Pt). Preferably, a $p^+$-type nitride semiconductor layer having an impurity concentration higher than in the p-type nitride semiconductor layer 117 is provided as the outermost surface layer of the p-type nitride semiconductor layer 117, though not shown, because this allows easier formation of the ohmic junction between the p-type nitride semiconductor layer 117 and the gate electrode 108. Preferably, the impurity concentration in the $p^+$-type nitride semiconductor layer is not less than $5 \times 10^{18}$ cm$^{-3}$.

Figure 8:
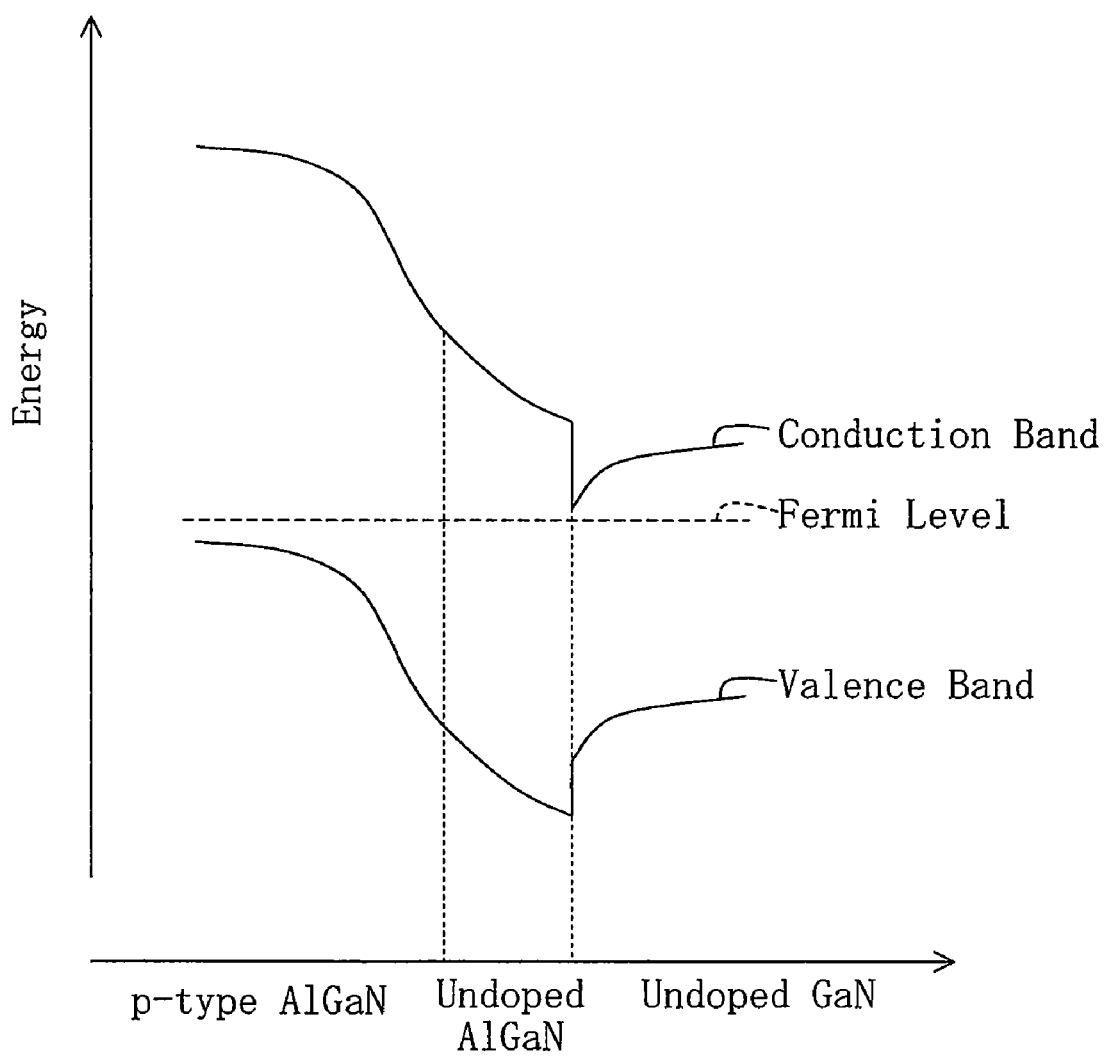
FIG. 8 is an energy band diagram under the gate electrode of the FET according to the second embodiment.

FIG. 8 shows an energy band diagram in the gate region of the FET 11 according to the present embodiment. By thus inserting the p-type nitride semiconductor layer 117 immediately under the gate electrode 118, the energy position of the channel present at the interface between the AlGaN layer as the second nitride semiconductor layer 104 and the GaN layer as the first nitride semiconductor layer 103 becomes higher than the Fermi level. As a result, the two-dimensional electron gas forming the channel only immediately under the gate electrode 118 can be depleted. This makes it possible to realize the threshold voltage of not less than 0 V, i.e., so-called normally-OFF operation.

Figure 9A:
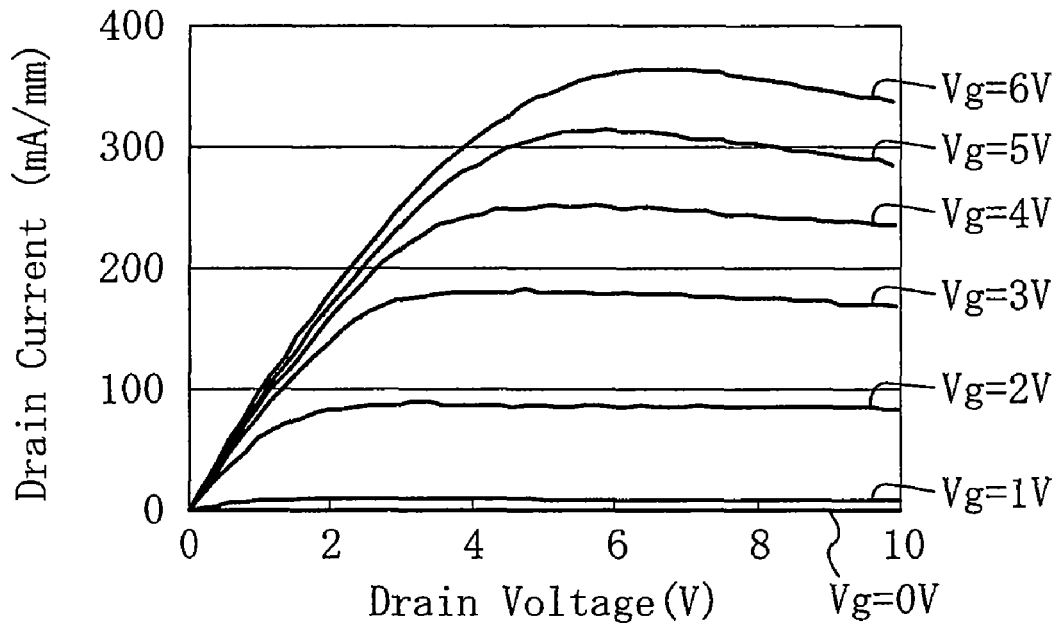
FIG. 9A is a graph showing a drain current flow in the FET according to the second embodiment and FIG. 9B is a graph showing a transconductance when a drain current flows in the FET according to the second embodiment and a gate voltage were varied.
Figure 9B:
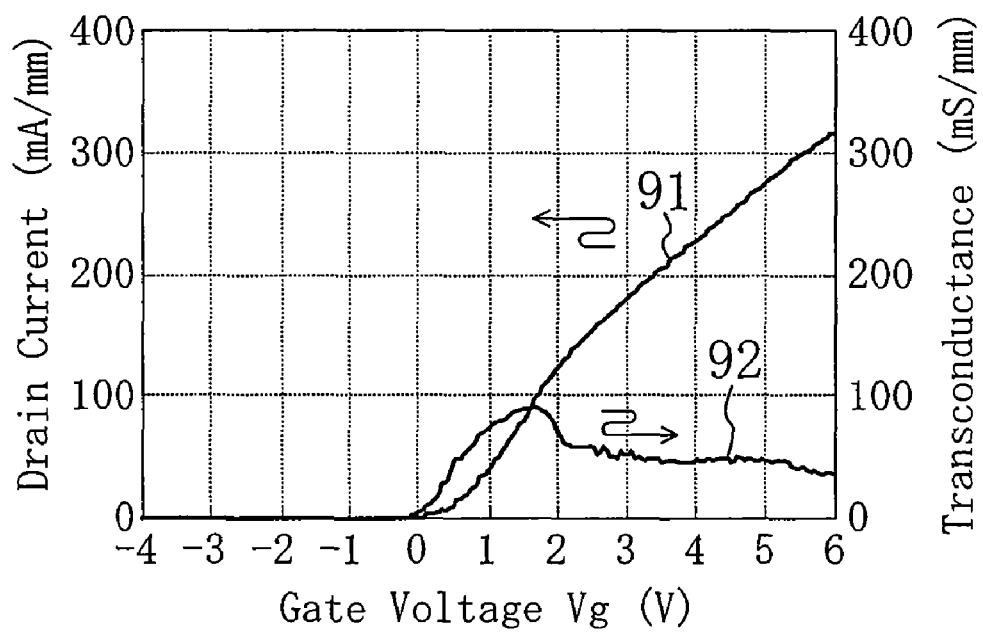

FIGS. 9A and 9B show a current/voltage characteristic obtained in the FET 11 according to the present embodiment. FIG. 9A shows a drain-current/drain-voltage characteristic when the gate voltage varied from 0 V to 6 V at 1 V intervals is applied. The characteristic 91 in FIG. 9B shows the drain-current/gate-voltage characteristic. The characteristic 92 in FIG. 9B shows a transconductance/gate-voltage characteristic. The depth of the concave portion 110a is 15 nm. It can be seen from FIGS. 9A and 9B that, in the present embodiment, the threshold voltage is about 0.6 V and a normally-OFF operation in which a drain current does not flow is implemented when the gate voltage is not more than 0 V. The maximum drain current is 390 mA/mm, which is extremely large as a drain current obtained in a normally-OFF nitride semiconductor FET.

Figure 10:
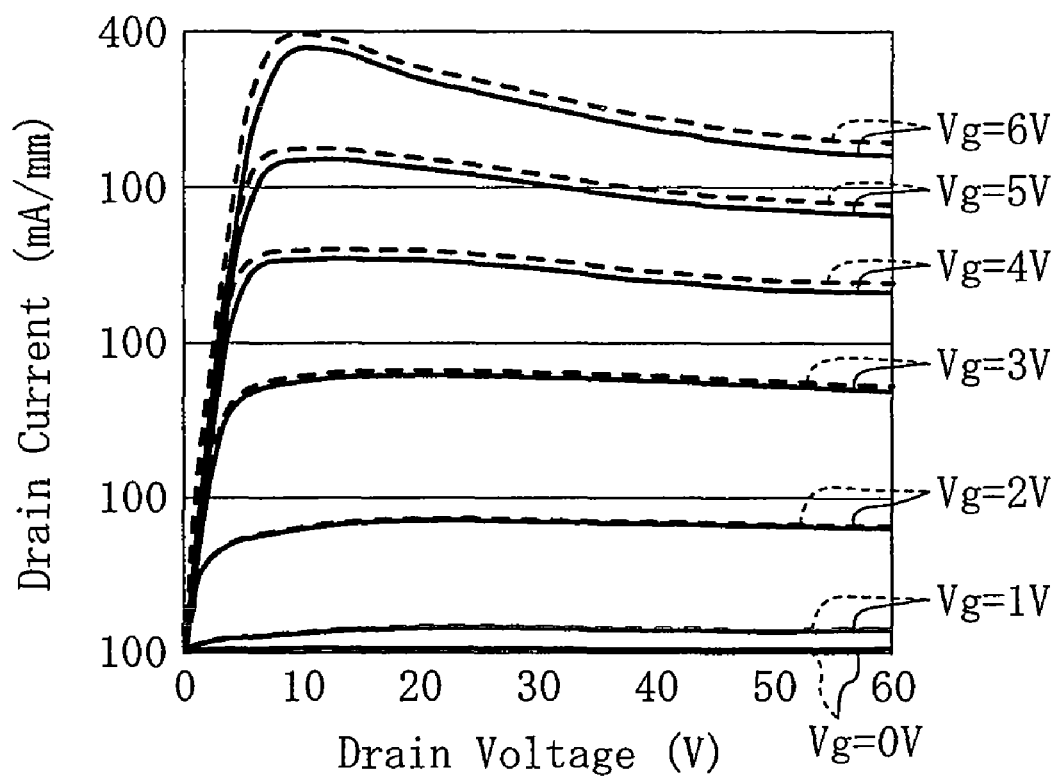
FIG. 10 is a graph showing a drain current flow in the FET according to the second embodiment when a dc voltage and a pulse voltage were applied thereto.

To the FET 11 according to the present embodiment, a dc voltage and a pulse voltage were applied, and the measurement of the drain current and the evaluation of the current collapse were performed. The results of the measurement and the evaluation are shown in FIG. 10. The measurement conditions for the drain current were the same as the measurement conditions described above in the first embodiment. Each of the solid lines represents the result when the pulse voltage was applied, while each of the broken lines represents the result when the dc voltage was applied. As shown in FIG. 10, the drain current (Ids_pulse) flow when the pulse voltage was applied was generally the same as the drain current (Ids_0) flow when the dc voltage was applied. From this, it can be seen that, in the FET 1 according to the present embodiment, the occurrence of the current collapse has been suppressed successfully.

The FET 11 according to the present embodiment can be fabricated by growing the p-type nitride semiconductor layer 117 in the concave portion 110a prior to the formation of the gate electrode 118 and then providing the gate electrode 118 on the upper surface of the p-type nitride semiconductor layer 117. A more detailed fabrication method will be shown hereinbelow.

Figure 12A:
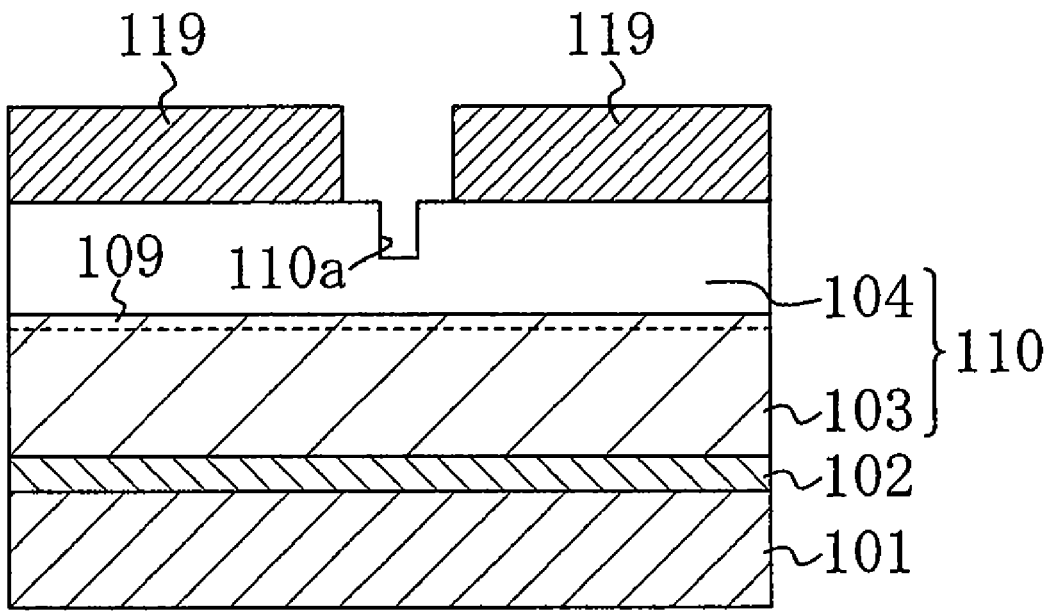
FIGS. 12A and 12B are cross-sectional views showing a first example of some of the steps of fabricating the FET according to the second embodiment.
Figure 12B:
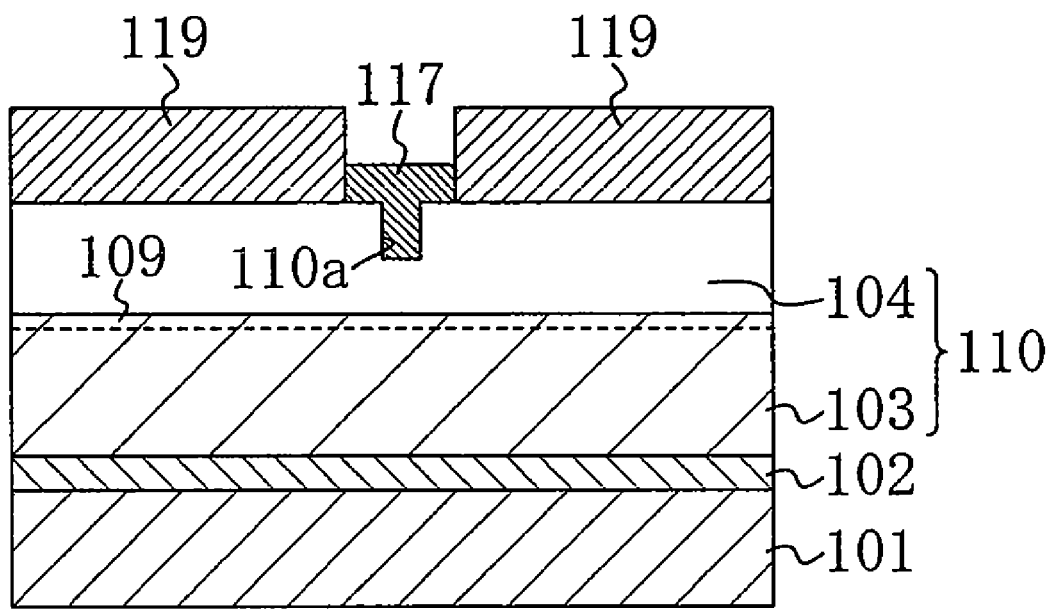
Figure 13A:
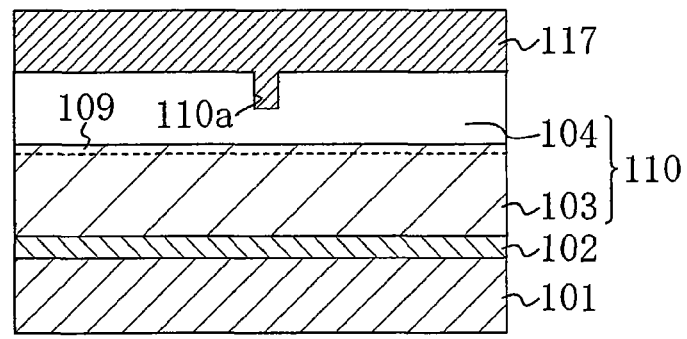
FIGS. 13A and 13B are cross-sectional views showing a second example of some of the steps of fabricating the FET according to the second embodiment.
Figure 13B:
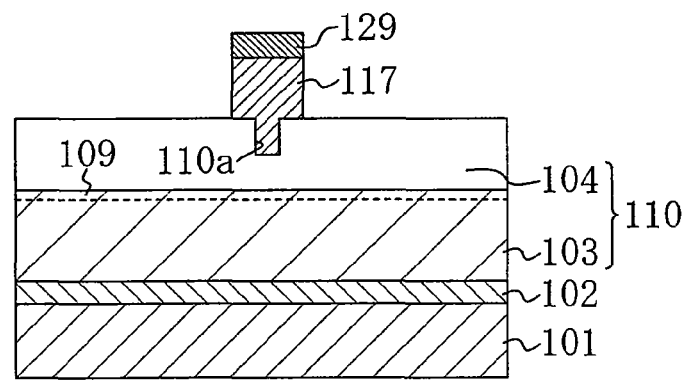

FIGS. 11A to 11E are cross-sectional views illustrating the method for fabricating the FET 11 according to the present embodiment. FIGS. 12A and 12B show a first method for forming the p-type nitride semiconductor layer 117. FIGS. 13A and 13B show a second method for forming the p-type nitride semiconductor layer 117.

Figure 11A:
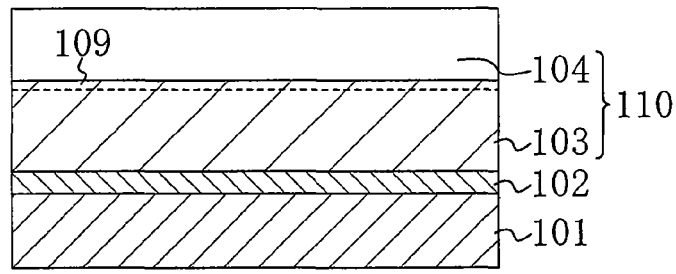
FIGS. 11A to 11E are cross-sectional views illustrating the steps of fabricating the FET according to the second embodiment.

First, as shown in FIG. 11A, the buffer layer 102, the first nitride semiconductor layer 103, and the second nitride semiconductor layer 104 are epitaxially grown successively on the surface of the substrate 101 by using, e.g., a MOCVD method (step (e)).

Figure 11B:
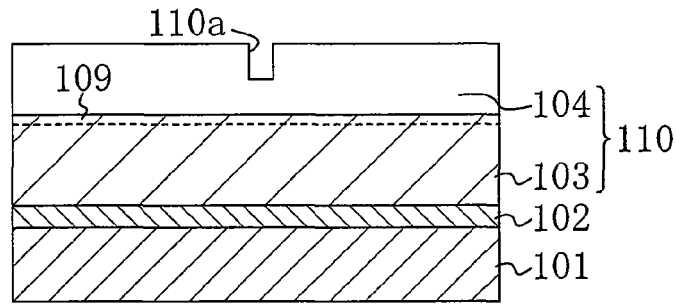

Next, dry etching is performed using, e.g., a chlorine ($Cl_2$) gas, whereby the concave portion 110a is formed in the surface of the second nitride semiconductor layer 104, as shown in FIG. 11B (step (f)).

Figure 11C:
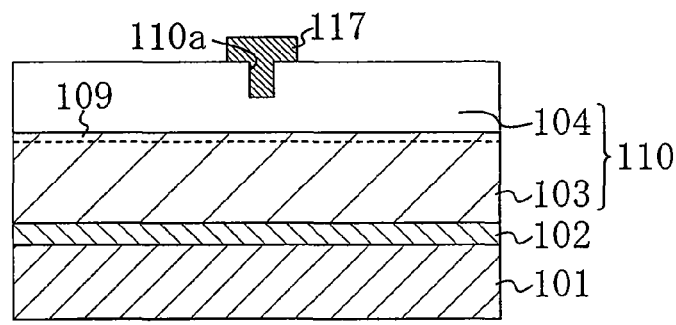

Subsequently, as shown in FIG. 11C, the p-type nitride semiconductor layer 117 is provided on the upper surface of the second nitride semiconductor layer 104 so as to cover the opening of the concave portion 110a (step (g)). At this time, there are two methods for forming the p-type nitride semiconductor layer 117, as shown below.

In the first method, a mask (e.g., a SiO$_2$ film) 119 is first formed on the upper surface of the second nitride semiconductor layer 104, as shown in FIG. 12A. Next, as shown in FIG. 12B, the p-type nitride semiconductor layer 117 is grown on the portion of the upper surface of the second nitride semiconductor layer 104 where the mask 119 is not formed. Thereafter, the mask 119 is removed.

In the second method, the p-type nitride semiconductor layer 117 is first grown over the entire upper surface of the second nitride semiconductor layer 104 and in the concave portion 110a, as shown in FIG. 13A. Next, as shown in FIG. 13B, a mask (e.g., a resist) 129 is formed on the portion of the upper surface of the p-type nitride semiconductor layer 117 located over the opening of the concave portion 110a. Then, dry etching is performed with respect to the unneeded portion of the p-type nitride semiconductor layer 117 other than the portion thereof formed over the concave portion 110a. Thereafter, the mask 129 is removed.

Figure 11D:
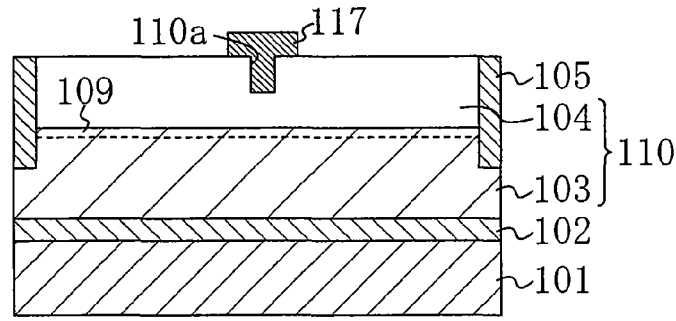

Subsequently, as shown in FIG. 11D, boron ions, e.g., are implanted to form the isolation regions 105.

Figure 11E:
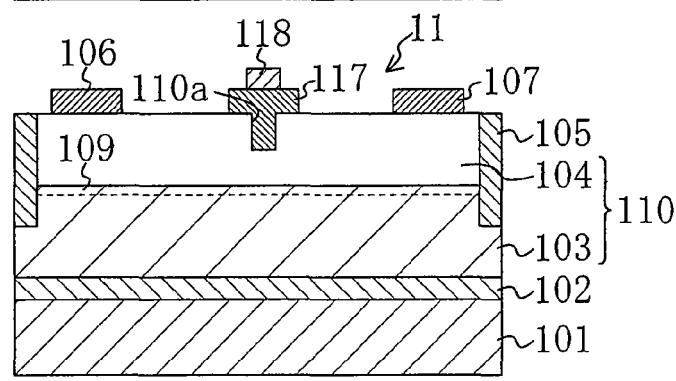

Subsequently, as shown in FIG. 11E, the source electrode 106 and the drain electrode 107 are formed on the upper surface of the second nitride semiconductor layer 104 by using, e.g., an electron beam deposition method and a lift-off method (step (h)). Thereafter, a thermal treatment is performed to form ohmic contacts.

Then, by using, e.g., an electron beam deposition method and a lift-off method, the gate electrode 108 is provided on the upper surface of the p-type nitride semiconductor layer 117 (step (h)). In this manner, the FET 11 according to the present embodiment can be fabricated.

When the p-type nitride semiconductor layer 117 is grown on the upper surface of the second nitride semiconductor layer 104, the p-type nitride semiconductor layer 117 may be grown on the upper surface of the second nitride semiconductor layer 104. Alternatively, it is also possible to provide another semiconductor layer different from the p-type nitride semiconductor layer 117 on the upper surface of the second nitride semiconductor layer 104 and then grow the p-type nitride semiconductor layer 117 on the upper surface of the other semiconductor layer.

The FET according to the present embodiment may also be a FET according to a first variation shown below.

Variation 1

Figure 14:
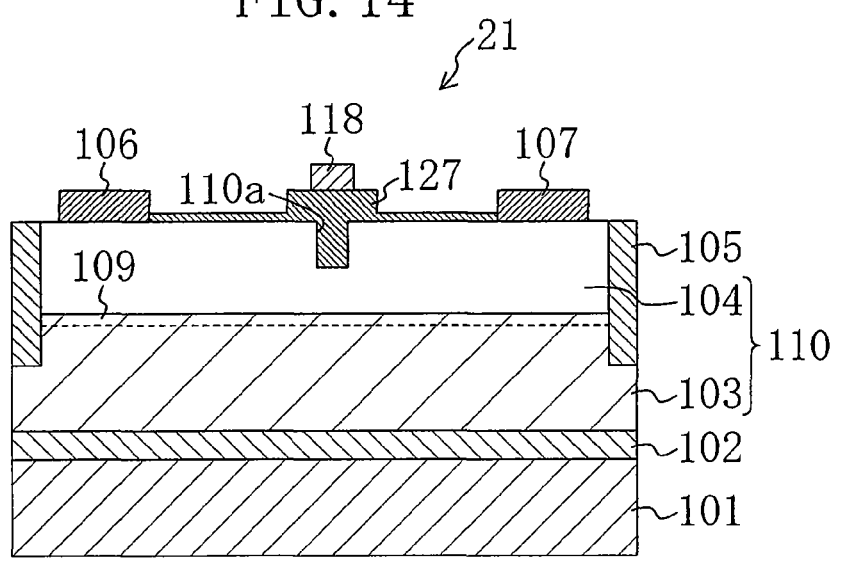
FIG. 14 is a cross-sectional view showing a structure of a FET according to a first variation of the second embodiment.

FIG. 14 is a cross-sectional view showing a structure of a FET 21 according to the first variation of the second embodiment.

In the FET 21 according to the present variation, a p-type nitride semiconductor layer 127 is provided not only in the concave portion 110a, but also on the respective portions of the upper surface of the second nitride semiconductor layer 104 located between the gate electrode 118 and the source electrode 106 and between the gate electrode 118 and the drain electrode 107. This makes it possible to reduce the surface states present at the surface of the second nitride semiconductor layer 104 and thereby further suppress the occurrence of the current collapse.

In addition, the portion of the p-type nitride semiconductor layer 127 provided on the upper surface of the second nitride semiconductor layer 104 preferably has a thickness of about 5 nm, because this allows suppression of a leakage current flowing between the source electrode 106 and the drain electrode 107 via the p-type nitride semiconductor layer 127.

Moreover, on the upper surface of the second nitride semiconductor layer 104, it is preferable that the p-type nitride semiconductor layer 127 is not in contact with the source electrode 106 and the drain electrode 107, but is partly removed, because this allows suppression of the leakage current flowing via the p-type nitride semiconductor layer 127.

As the method for fabricating the FET 21 according to the present variation, the fabrication method described in the second embodiment is preferably used. When the p-type nitride semiconductor layer 127 is provided, the second method according to the second embodiment is preferably used.

Embodiment 3

Figure 15:
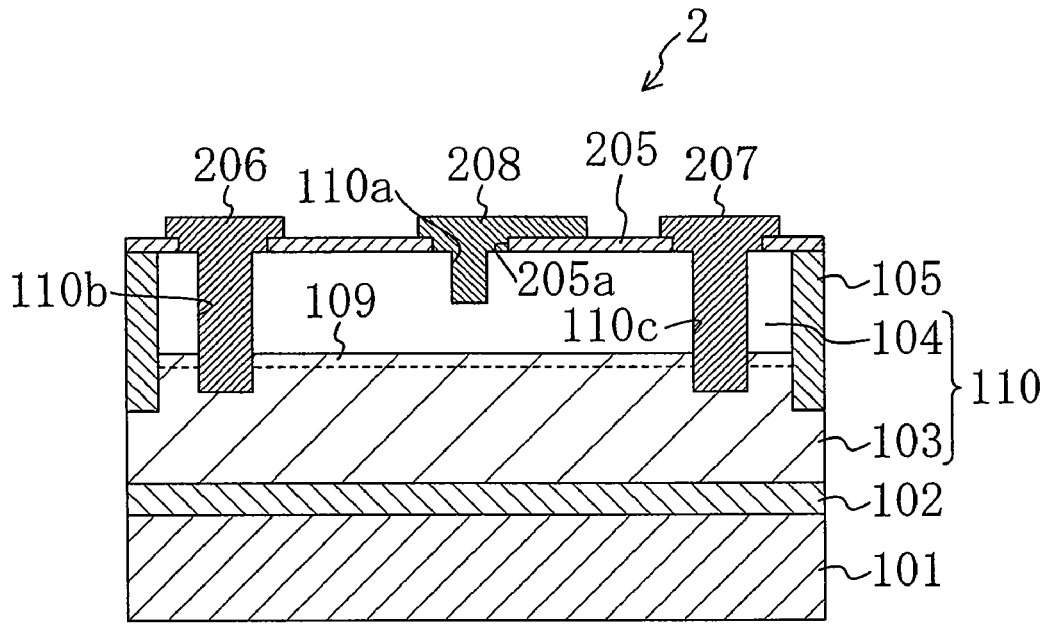
FIG. 15 is a cross-sectional view showing a structure of a FET according to a third embodiment of the present invention.

FIG. 15 is a cross-sectional view showing a structure of a FET 2 according to the third embodiment of the present invention.

In the FET 2 according to the present embodiment, an insulating film 205 is provided on the upper surface of the second nitride semiconductor layer 104, and a source electrode 206, a drain electrode 207, and a gate electrode 208 are provided on the upper surface of the second nitride semiconductor layer 104. The gate electrode 208 is formed such that the portion thereof provided on the upper surface of the second nitride semiconductor layer 104 is asymmetrical with respect to the center axis of the bottom surface of the concave portion 110a. Moreover, the source electrode 206 and the drain electrode 207 extend through the second nitride semiconductor layer 104. In the description given hereinbelow, portions different from those of the foregoing first embodiment will be primarily shown.

As shown in FIG. 15, in the FET 2 according to the present embodiment, the buffer layer 102, the first nitride semiconductor layer 103, and the second nitride semiconductor layer 104 are stacked successively on the substrate 101. The first nitride semiconductor layer 103 and the second nitride semiconductor layer 104 constitute the semiconductor multilayer 110. In the vicinity of the upper surface of the first nitride semiconductor layer 103, the two-dimensional electron gas layer 109 is formed. The concave portion 110a is formed in the second nitride semiconductor layer 104 to have a depth of not less than 15 nm. In other words, ΔVp is not less than 2.5 V.

The insulating film 205 is provided on the portion of the upper surface of the second nitride semiconductor layer 104 where the source electrode 206, the drain electrode 207, and the gate electrode 208 are not provided. As the insulating film 205, there can be used one of a SiN film, a SiO$_2$ film, an AlN film, an Al$_2$O$_3$ film, a CaF$_2$ film, and a HfO$_2$ film. Otherwise, a film obtained by stacking two or more of these films may also be used as the insulating film 205. The thickness of the insulating film 205 is preferably not less than 1 nm and not more than 1000 nm, and is, e.g., 100 nm. This allows a reduction in the surface states present at the surface of the second nitride semiconductor layer 104. In the vicinity of the opening of the concave portion 110a, an opening 205a in the insulating film 205 is larger in size than the opening of the concave portion 110a, which will be described later when a method for fabricating the FET 2 is described.

The gate electrode 208 is provided on the upper surface of the second nitride semiconductor layer 104 so as to cover the opening of the concave portion 110a, and is also buried in the concave portion 110a. On the upper surface of the second nitride semiconductor layer 104, the length of the extended portion of the gate electrode is larger on the side with the drain electrode than on the side with the source electrode. As a result, it is possible to not only suppress the occurrence of the current collapse but also reduce the localization of an electric field between the gate electrode 208 and the drain electrode 207. As a result, the breakdown voltage of the transistor can be improved.

Moreover, the source electrode 206 and the drain electrode 207 are provided on the upper surface of the second nitride semiconductor layer 104 to have the concave portion 110a interposed therebetween, and also extend through the second nitride semiconductor layer 104 to reach the two-dimensional electron gas layer 109. Since the side surface or lower surface of the source electrode 206 and the side surface or lower surface of the drain electrode 207 are in contact with the two-dimensional electron gas layer 109, it becomes possible to reduce the ohmic contact resistance of each of the source electrode 206 and the drain electrode 207.

The FET 2 according to the present embodiment can be fabricated in accordance with, e.g., a method shown hereinbelow.

First, by using, e.g., a MOCVD method, the buffer layer 102, the first nitride semiconductor layer 103, and the second nitride semiconductor layer 104 are epitaxially grown successively on the substrate 101.

Next, by performing dry etching using, e.g., a $Cl_2$ gas, the concave portion 110a is formed in the second nitride semiconductor layer 104, and a source-electrode hole 110b for forming the source electrode 206 and a drain-electrode hole 110c for forming the drain electrode 207 are formed. At this time, it is preferable that the source-electrode hole 110b and the drain-electrode hole 110c are formed to reach the two-dimensional electron gas layer 109. For example, each of the source-electrode hole 110b and the drain-electrode hole 110c is formed to have a depth of, e.g., 65 nm.

Subsequently, B ions, e.g., are implanted to form the isolation regions 105.

Subsequently, by using, e.g., a plasma CVD method and a sputtering method, the insulating film 205 is formed on the upper surface of the second nitride semiconductor layer 104.

Subsequently, by using a dry etching method, the portions of the insulating film 205 where the gate electrode 208, the source electrode 206, and the drain electrode 207 are to be formed are removed to form electrode windows. In the formation of the electrode window 205a for the gate electrode, the opening of the electrode window 205a is preferably formed to be larger in size than the opening of the concave portion 110a. As a result, it is possible to suppress the remaining of the insulating film 205 on the bottom surface and inner wall surface of the concave portion 110a.

Subsequently, by using, e.g., an electron beam deposition method and a lift-off method, the source electrode 206 is formed in the source-electrode hole 110b and the drain electrode 207 is formed in the drain-electrode hole 110c. Thereafter, a thermal treatment is performed to form ohmic contacts.

Then, by using, e.g., an electron beam deposition method and a lift-off method, the gate electrode 208 is buried in the concave portion 110a and provided on the upper surface of the second nitride semiconductor layer 104 so as to cover the opening of the concave portion 110a. In this manner, the FET 2 according to the present embodiment can be fabricated.

In the FET 2 according to the present embodiment, the occurrence of the current collapse can be suppressed in the same manner as in the first embodiment described above. Further, by providing the insulating film 205 on the upper surface of the second nitride semiconductor layer 104, the surface states present at the surface of the second nitride semiconductor layer 104 can be reduced and the occurrence of the current collapse can be further suppressed. In addition, by forming the gate electrode 208 into an asymmetrical structure, the breakdown voltage of the FET 2 can be improved. Moreover, by forming the electrode window such that it is larger in size than the opening of the concave portion 110a in providing the gate electrode 208, the production yield of the FET 2 can be improved.

Figure 16:
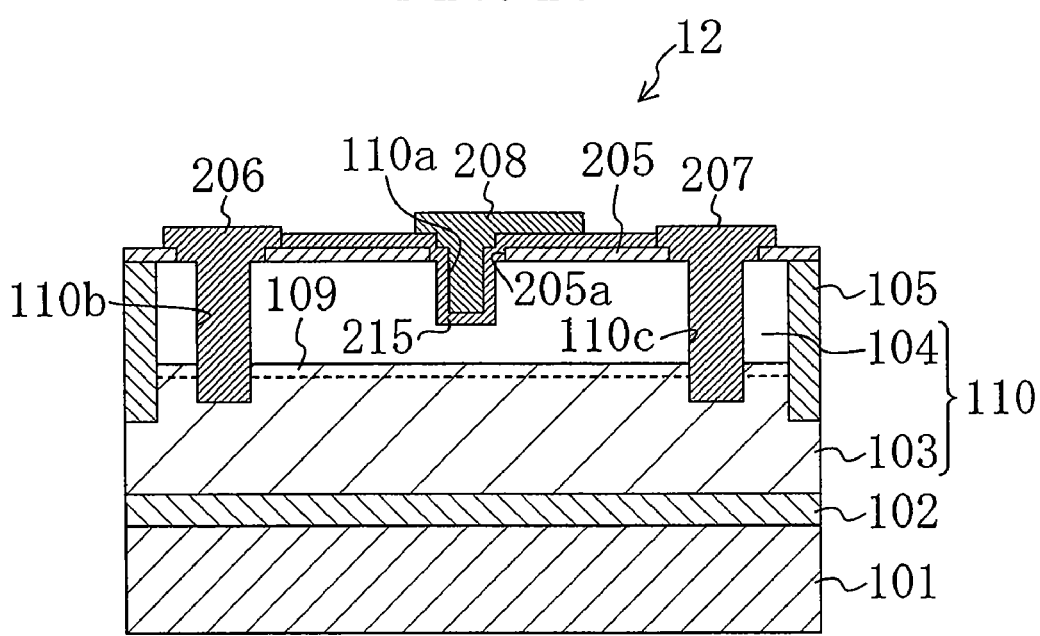
FIG. 16 is a cross-sectional view showing another structure of the FET according to the third embodiment.

In the present embodiment, an insulating film (fourth insulating film) 215 may also be provided in the concave portion 110a as in a FET 12 shown in FIG. 16. The insulating film 215 is in contact with the bottom surface and inner wall surface of the concave portion 110a, and is also in contact with the insulating film 205. The gate electrode 208 is in contact with the upper surface of the insulating film 215.

Embodiment 4

Figure 17:
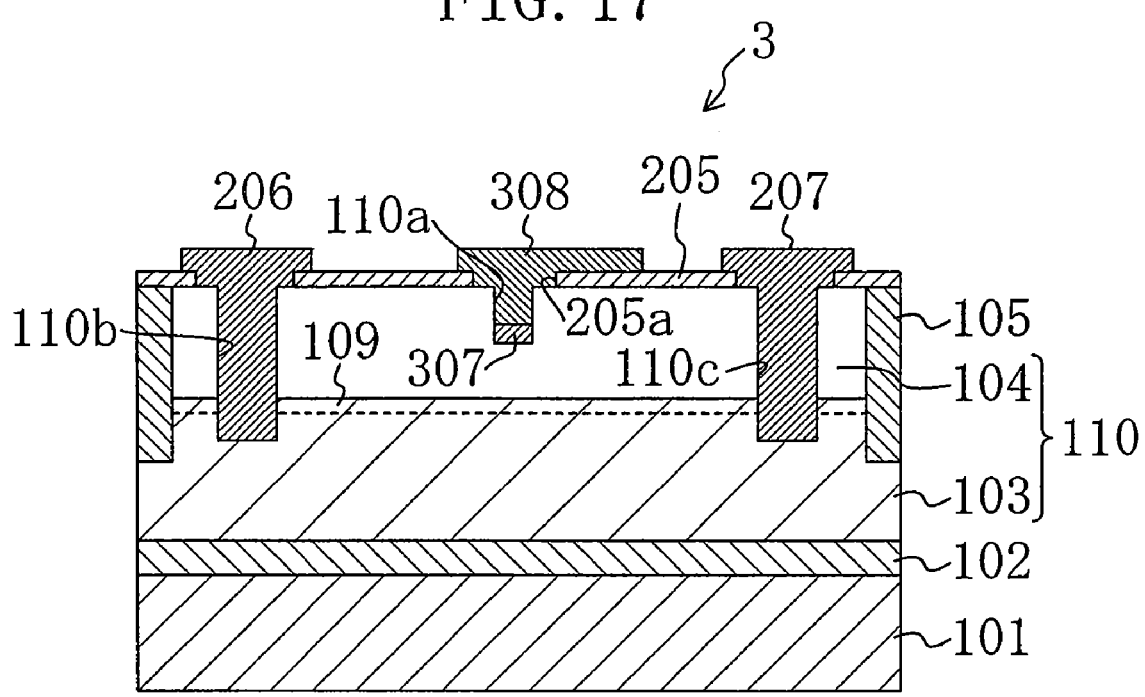
FIG. 17 is a cross-sectional view showing a structure of a FET according to a fourth embodiment of the present invention.

FIG. 17 is a cross-sectional view showing a structure of a FET 3 according to the fourth embodiment of the present invention.

In the FET 3 according to the present embodiment, a second insulating film 307 is provided on the bottom surface of the concave portion 110a. In the description given hereinbelow, portions different from those of the first embodiment will be primarily shown.

As shown in FIG. 17, in the FET 3 according to the present embodiment, the buffer layer 102, the first nitride semiconductor layer 103, and the second nitride semiconductor layer 104 are successively stacked on the substrate 101. The first nitride semiconductor layer 103 and the second nitride semiconductor layer 104 constitute the semiconductor multilayer 110. In the vicinity of the upper surface of the first nitride semiconductor layer 103, the two-dimensional electron gas layer 109 is formed. The concave portion 110a is formed in the second nitride semiconductor layer 104 to have a depth of not less than 15 nm. In other words, $\Delta Vp$ is not less than 2.5 V.

The second insulating film 307 is interposed between the lower surface of a gate electrode 308 and the bottom surface of the concave portion 110a. As the second insulating film 307, there can be used one of a SiN film, a $SiO_2$ film, an AlN film, an $Al_2O_3$ film, a $CaF_2$ film, and a $HfO_2$ film. Otherwise, a film obtained by stacking two or more of these films may also be used. The thickness of the second insulating film 307 is preferably not less than 1 nm and not more than 500 nm, and is, e.g., 100 nm. This improves the adhesion of the gate electrode 308 to the bottom surface of the concave portion 110a and can prevent the gate electrode 308 from peeling off the concave portion 110a.

The gate electrode 308 is provided on the upper surface of the second nitride semiconductor layer 104 so as to cover the opening of the concave portion 110a, and also on the upper surface of the second insulating film 307 in the concave portion 110a.

FIGS. 18A to 18G are cross-sectional view illustrating a method for fabricating the FET 3 according to the present embodiment.

Figure 18A:
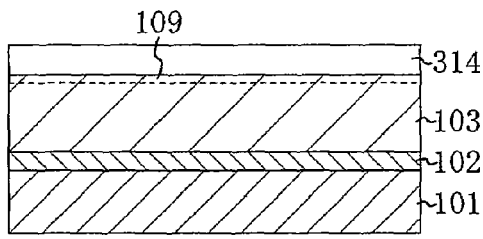
FIGS. 18A to 18G are cross-sectional views illustrating the steps of fabricating the FET according to the fourth embodiment.

First, as shown in FIG. 18A, the buffer layer 102, the first nitride semiconductor layer 103, and an undoped $Al_{0.25}GaN$ layer (grown layer) 314 are epitaxially grown successively on the surface of the substrate 101 using, e.g., a MOCVD method (step (a)).

Figure 18B:
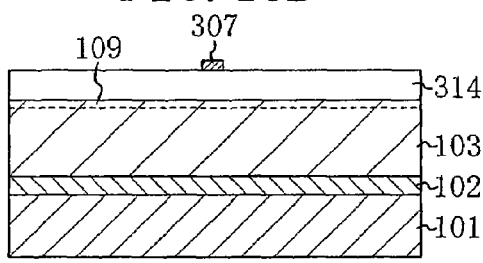

Then, as shown in FIG. 18B, the second insulating film 307 is provided on the portion of the upper surface of the undoped $Al_{0.25}GaN$ layer 314 where the gate electrode 308 is to be formed by using a plasma CVD method (step (b)).

Figure 18C:
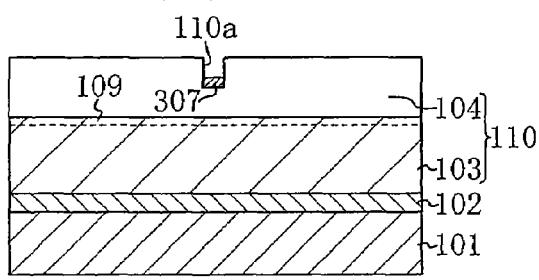

Subsequently, by using, e.g., a MOCVD method, the undoped $Al_{0.25}GaN$ layer 314 is re-grown (step (c)). At this time, because the second insulating film 307 serves as a mask, the undoped $Al_{0.25}GaN$ layer is not re-grown on the portion of the upper surface of the undoped $Al_{0.25}GaN$ layer 314 where the second insulating film 307 is formed. On the other hand, the undoped $Al_{0.25}GaN$ layer 314 is re-grown on the portion of the upper surface of the undoped $Al_{0.25}GaN$ layer 314 where the second insulating film 307 is not formed. As a result, as shown in FIG. 18C, the second nitride semiconductor layer 104 is formed on the upper surface of the first nitride semiconductor layer 103, and the concave portion 110a having the bottom surface composed of the second insulating film 307 is formed in the second nitride semiconductor layer 104. At this stage, it is also possible to remove the second insulating film 307 to form the concave portion 110a as a concave portion in which the insulating film 307 is not provided as the bottom surface.

By thus forming the concave portion 110a through the regrowth of the undoped $Al_{0.25}GaN$ layer 314, the following two advantages are offered compared with the case where the concave portion 110a is formed by etching the second nitride semiconductor layer 104. The first advantages is that, because the depth of the concave portion 110a can be easily controlled, the production yield of the FET 3 is improved. The second advantage is that, because damage is not induced by dry etching in the inner wall surface of the concave portion 110a, the gate characteristic of the FET 3 can be improved.

Figure 18D:
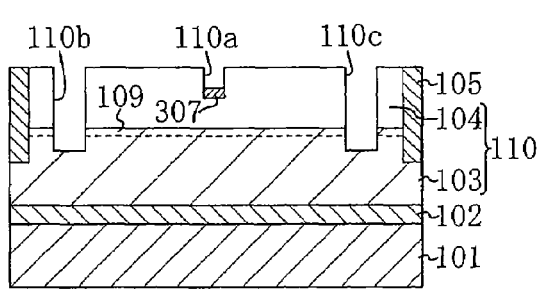

Subsequently, as shown in FIG. 18D, the source-electrode hole 110b and the drain-electrode hole 110c are formed by using a dry etching method to reach the two-dimensional electron gas layer 109. Thereafter, B ions, e.g., are implanted to form the isolation regions 105.

Figure 18E:
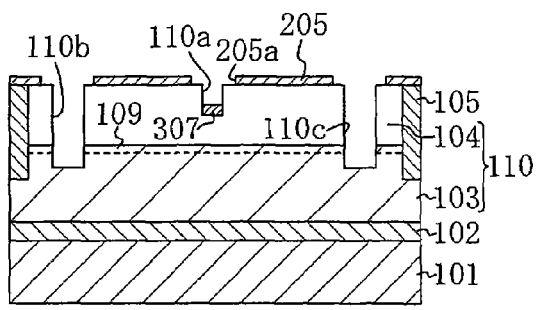

Subsequently, by using a plasma CVD method and a sputtering method, the insulating film 205 is formed on the upper surface of the second nitride semiconductor layer 104. Then, as shown in FIG. 18E, the insulating film 205 is partly removed by using a dry etching method to form the respective electrode windows for forming the source electrode 206, the drain electrode 207, and the gate electrode 308. At this time, the gate electrode-window is preferably formed to be larger in size than the opening of the hole.

Figure 18F:
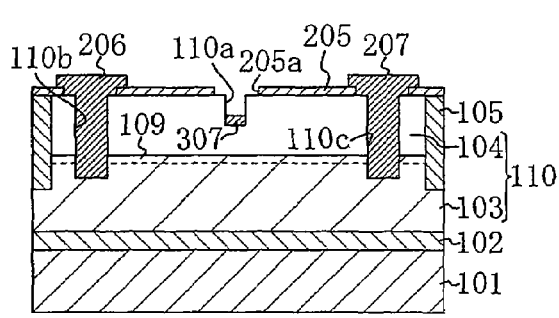

Subsequently, as shown in FIG. 18F, the source electrode 206 and the drain electrode 207 are formed by using, e.g., an electron beam deposition method and a lift-off method. Thereafter, a thermal treatment is performed to form ohmic contacts.

Figure 18G:
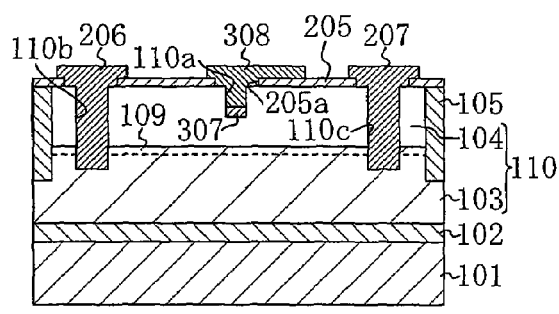

Then, as shown in FIG. 18G, the gate electrode 308 is provided on the upper surface of the second nitride semiconductor layer 104 so as to cover the opening of the concave portion 110a, and also on the upper surface of the second insulating film 307 in the concave portion 110a by using a electron beam deposition and a lift-off method (step (d)). In this manner, the FET 3 according to the present embodiment can be fabricated.

In the FET 3 according to the present embodiment, the occurrence of the current collapse can be suppressed in the same manner as in the third embodiment described above. Moreover, since the gate electrode 308 is provided in the concave portion 110a with the second insulating film 307 interposed therebetween, it becomes possible to improve the adhesion of the gate electrode 308. Further, since the concave portion 110a in the second nitride semiconductor layer 104 is formed by growing the second nitride semiconductor layer 104 in two steps, the depth of the concave portion 110a can be controlled more easily than in the case where the concave portion 110a is formed by using a dry etching method. In addition, since damage is not induced by dry etching in the inner surface of the concave portion 110a, it becomes possible to obtain an excellent gate characteristic.

Embodiment 5

Figure 19:
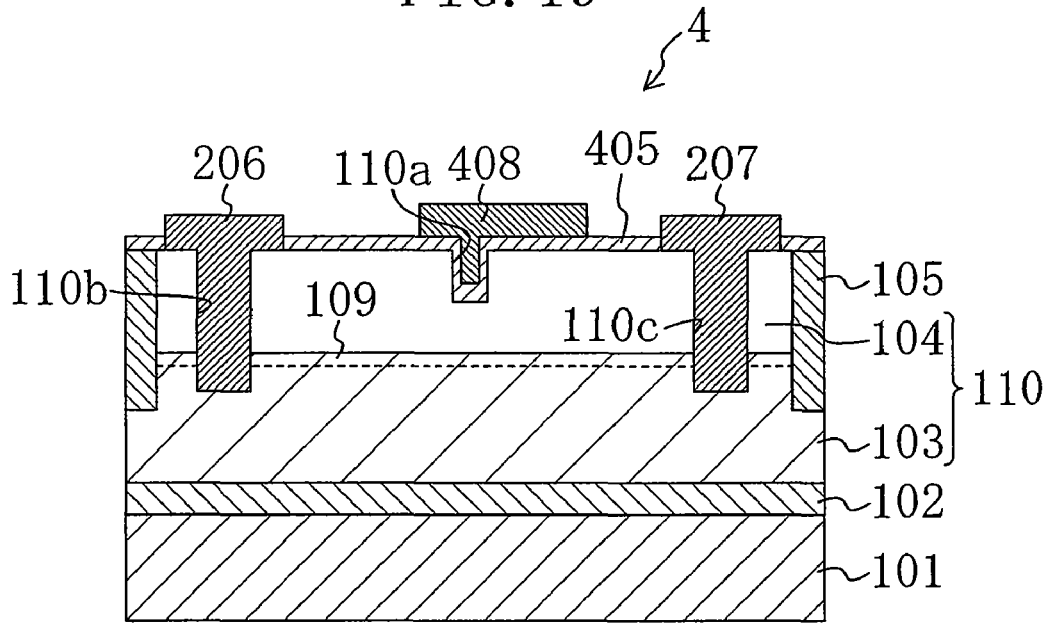
FIG. 19 is a cross-sectional view showing a structure of a FET according to a fifth embodiment of the present invention.

FIG. 19 is a cross-sectional view showing a structure of a FET 4 according to the fifth embodiment of the present invention.

In the present embodiment, a third insulating film 405 is provided on the bottom surface and also inner wall surface of the concave portion 110a. In the description given hereinbelow, portions different from those of the first embodiment will be primarily shown.

As shown in FIG. 19, in the FET 4 according to the present embodiment, the buffer layer 102, the first nitride semiconductor layer 103, and the second nitride semiconductor layer 104 are successively stacked on the substrate 101. The first nitride semiconductor layer 103 and the second nitride semiconductor layer 104 constitute the semiconductor multilayer 110. In the vicinity of the upper surface of the first nitride semiconductor layer 103, the two-dimensional electron gas layer 109 is formed. The concave portion 110a is formed in the second nitride semiconductor layer 104 to have a depth of not less than 15 nm. In other words, $\Delta Vp$ is not less than 2.5 V.

The third insulating film 405 is provided on the portions of the upper surface of the second nitride semiconductor layer 104 where the source electrode 206 and the drain electrode 207 are not provided, and also on the bottom surface and inner wall surface of the concave portion 110a. Since the third insulating film 405 is provided also on the bottom surface and inner wall surface of the concave portion 110a, it is possible to reduce a gate leakage current and improve the breakdown voltage of the FET 4. As the third insulating film 405, a film made of generally the same material and having the same thickness as the insulating film 205 used in the third embodiment described above can be used.

A gate electrode 408 covers the opening of the concave portion 110a and is provided on the upper surface of the second nitride semiconductor layer 104 coated with the third insulating film 405.

The FET 4 according to the present embodiment can be fabricated in accordance with a method shown hereinbelow.

First, by using, e.g., a MOCVD method, the buffer layer 102, the first nitride semiconductor layer 103, and the second nitride semiconductor layer 104 are epitaxially grown successively on the surface of the substrate 101.

Next, by performing dry etching using, e.g., a $Cl_2$ gas, the concave portion 110a is formed in the surface of the second nitride semiconductor layer 104, and the source-electrode hole 110b for forming the source electrode 206 and the drain-electrode hole 110c for forming the drain electrode 207 are formed.

Subsequently, boron ions, e.g., are implanted to form the isolation regions 105.

Subsequently, by using, e.g., a plasma CVD method and a sputtering method, the third insulating film 405 is formed on the upper surface of the second nitride semiconductor layer 104. At this time, the third insulating film 405 is also formed on the bottom surface and inner side wall of the concave portion 110a. Alternatively, the third insulating film 405 may also be formed on the upper surface of the second nitride semiconductor layer 104 on which the insulating film 205 is formed in the same manner as in the third embodiment described above.

Subsequently, by using a dry etching method, the portions of the third insulating film 405 where the source electrode 206 and the drain electrode 207 are to be formed are removed to form the electrode window for the source electrode 206 and the electrode window for the drain electrode 207.

Subsequently, by using, e.g., an electron beam deposition method and a lift-off method, the source electrode 206 and the drain electrode 207 are formed. Thereafter, a thermal treatment is performed to form ohmic contacts.

Then, by using, e.g., an electron beam deposition method and a lift-off method, the gate electrode 408 is provided on the upper surface of the second nitride semiconductor layer 104 coated with the third insulating film 405 so as to cover the opening of the concave portion 110a. In this manner, the FET 4 according to the present embodiment can be fabricated.

In the FET 4 according to the present embodiment, the occurrence of the current collapse can be suppressed in the same manner as in the first embodiment described above. Further, since the third insulating film 405 is provided on the bottom surface and inner wall surface of the concave portion 110a, it is possible to reduce the gate leakage current and improve the breakdown voltage of the FET 4.

Embodiment 6

Figure 20:
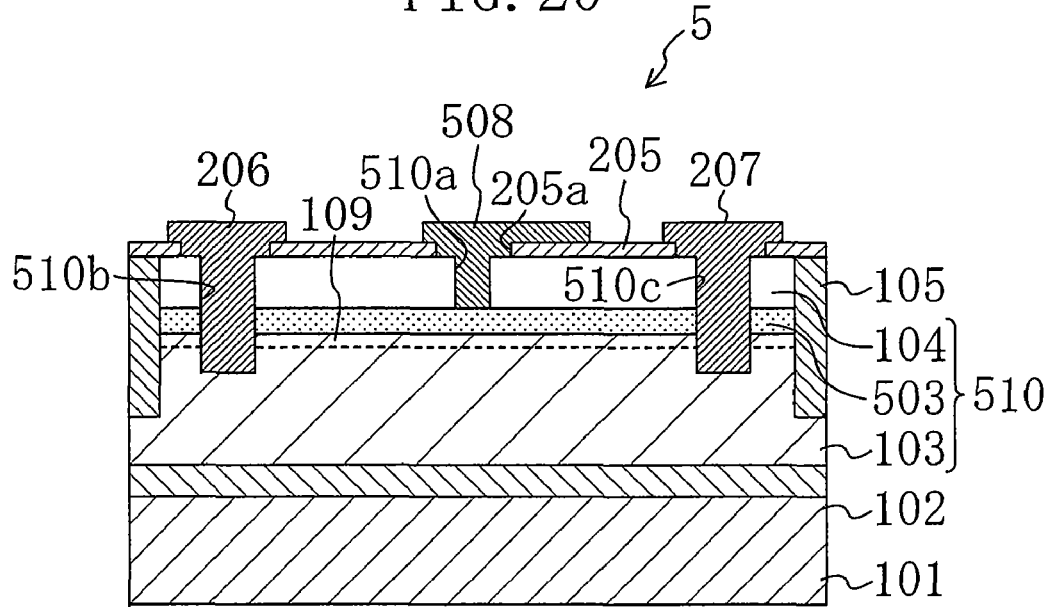
FIG. 20 is a cross-sectional view showing a structure of a FET according to a sixth embodiment of the present invention.

FIG. 20 is a cross-sectional view showing a structure of a FET 5 according to the sixth embodiment of the present invention.

In the FET 5 according to the present embodiment, the first nitride semiconductor layer 103, the second nitride semiconductor layer 104, and an etching stop layer 503 constitute a semiconductor multilayer 510.

As shown in FIG. 20, in the FET 5 according to the present embodiment, the buffer layer 102, the first nitride semiconductor layer 103, the etching stop layer 503, and the second nitride semiconductor layer 104 are successively stacked on the substrate 101. In the vicinity of the upper surface of the first nitride semiconductor layer 103, the two-dimensional electron gas layer 109 is formed. The source electrode 206 and the drain electrode 207 are provided on the upper surface of the second nitride semiconductor layer 104 to have a concave portion 510a interposed therebetween, and are also formed to extend through the second nitride semiconductor layer 104 and the etching stop layer 503 to reach the two-dimensional electron gas layer 109.

The concave portion 510a extends through the second nitride semiconductor layer 104 to have the bottom surface thereof formed of the upper surface of the etching stop layer 503. The etching stop layer 503 is composed of a nitride semiconductor layer having a band gap larger than that of the second nitride semiconductor layer 104, such as, e.g., an AlGaN layer or an AlN layer. Because the composition ratio of Al is larger in the etching stop layer 503 than in the second nitride semiconductor layer 104, the etching stop layer 503 has an etching rate lower than that of the second nitride semiconductor layer 104, and therefore functions as an etching stopper. Preferably, the etching stop layer 503 is, e.g., an undoped AlN layer. The thickness of the etching stop layer 503 is preferably not less than 1 nm and not more than 50 nm, and is, e.g., 5 nm. By thus providing the etching stop layer 503, the depth of the concave portion 610a can be controlled even when a dry etching method is used. As a result, the FET can be produced with excellent reproducibility.

The FET 5 according to the present embodiment can be fabricated in accordance with, e.g., a method shown hereinbelow.

First, by using, e.g., a MOCVD method, the buffer layer 102, the first nitride semiconductor layer 103, the etching stop layer 503, and the second nitride semiconductor layer 104 are epitaxially grown successively on the surface of the substrate 101.

Next, by performing dry etching using, e.g., a Cl$_2$ gas with respect to the surface of the second nitride semiconductor layer 104, the concave portion 510a is formed in the surface of the second nitride semiconductor layer 104. Since the dry etching rate of the etching stop layer 503 is lower than that of the second nitride semiconductor layer 104, the etching stops at the surface of the etching stop layer 503. As a result, the concave portion 510a can be formed with excellent reproducibility. Thereafter, a source-electrode hole 510b for forming the source electrode 206 and a drain-electrode hole 510c for forming the drain electrode 207 are formed.

Subsequently, boron ions, e.g., are implanted to form the isolation regions 105.

Subsequently, by using, e.g., a plasma CVD method and a sputtering method, the insulating film 205 is formed on the upper surface of the second nitride semiconductor layer 104.

Subsequently, by using a dry etching method, the insulating film 205 is partly etched to form the respective electrode windows for the source electrode 206, the drain electrode 207, and a gate electrode 508.

Subsequently, by using, e.g., an electron beam deposition method and a lift-off method, the source electrode 206 and the drain electrode 207 are formed. Thereafter, a thermal treatment is performed to form ohmic contacts.

Then, by using, e.g., an electron beam deposition method and a lift-off method, the gate electrode 508 is buried in the concave portion 510a and provided on the upper surface of the second nitride semiconductor layer 104 so as to cover the opening of the concave portion 510a. In this manner, the FET 5 according to the present embodiment can be fabricated.

In the FET 5 according to the present embodiment, the occurrence of the current collapse can be suppressed in the same manner as in the first embodiment described above. In addition, since the etching stop layer 503 is provided, the depth of the concave portion 510a can be easily controlled.

Embodiment 7

Figure 21:
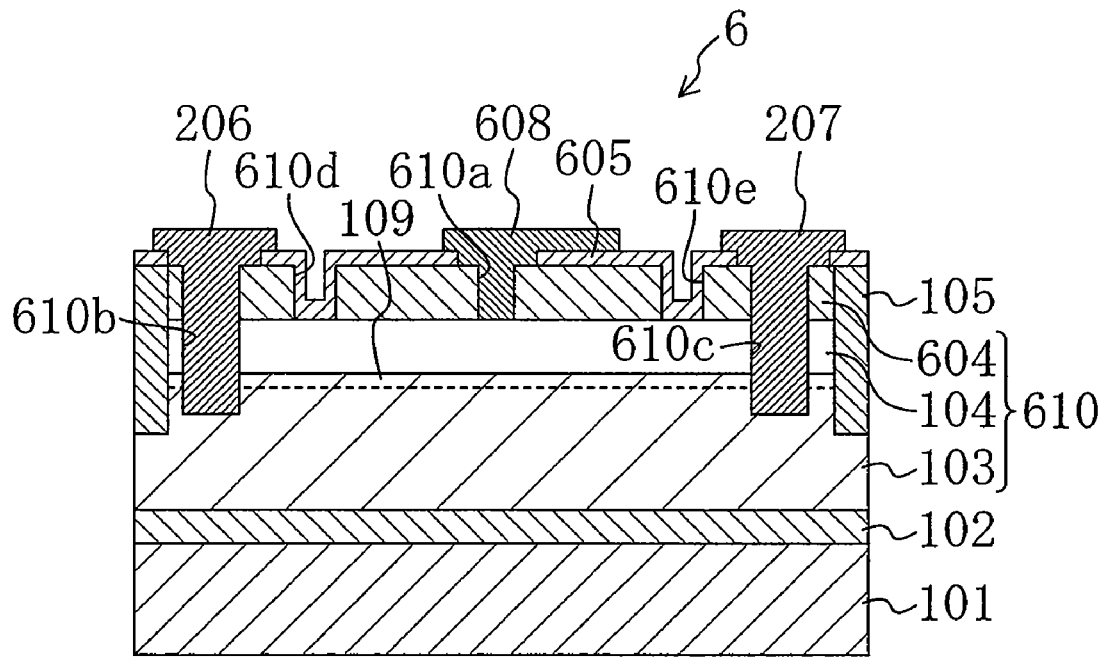
FIG. 21 is a cross-sectional view showing a structure of a FET according to a seventh embodiment of the present invention.
Figure 22:
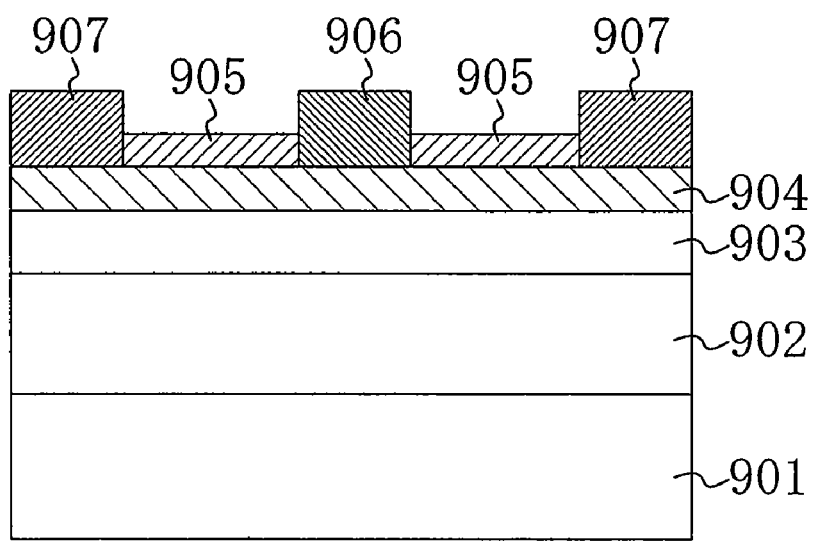
FIG. 22 is a cross-sectional view showing a structure of a FET according to a conventional embodiment.

FIG. 21 is a cross-sectional view showing a structure of a FET 6 according to the seventh embodiment of the present invention.

In the present embodiment, an n-type nitride semiconductor layer (n-type nitride-based compound semiconductor layer) 604 is provided on the upper surface of the second nitride semiconductor layer 104, and a concave portion 610a is formed in the n-type nitride semiconductor layer 604, which will be shown specifically hereinbelow.

As shown in FIG. 21, in the FET 6 according to the present embodiment, the buffer layer 102, the first nitride semiconductor layer 103, the second nitride semiconductor layer 104, and the n-type nitride semiconductor layer 604 are successively stacked on the substrate 101. The first nitride semiconductor layer 103, the second nitride semiconductor layer 104, and the n-type nitride semiconductor layer 604 constitute a semiconductor multilayer 610. In the vicinity of the upper surface of the first nitride semiconductor layer 103, the two-dimensional electron gas layer 109 is formed. As the n-type nitride semiconductor layer 604, any nitride semiconductor layer presenting an n-type polarity conductivity is appropriate, such as, e.g., a GaN layer or an AlGaN layer each doped with Si. The GaN layer doped with Si can be formed as a film thicker than the AlGaN layer doped with Si without incurring a crack. Such a thicker film is preferred, because this can increase the depth of a recessed portion.

The source electrode 206 and the drain electrode 207 are formed to extend through the n-type nitride semiconductor layer 604 and the second nitride semiconductor layer 104 to reach the two-dimensional electron gas layer 109. A gate electrode 608 is formed to extend through the n-type nitride semiconductor layer 604 and reach the upper surface of the second nitride semiconductor layer 104. Further, first and second trenches 610d and 610e are formed in the n-type nitride semiconductor layer 604. The first trench 610d is formed between the gate electrode 608 and the source electrode 206. The second trench 610e is formed between the gate electrode 608 and the drain electrode 207. Since the first and second trenches 610d and 610e are thus formed, a leakage current flowing via the n-type nitride semiconductor layer 604 can be reduced. Of the first and second trenches, only either one may be formed appropriately. The configuration of each of the first and second trenches is not limited provided that the n-type nitride semiconductor layer 604 is removed.

An insulating film 605 is provided on the portions of the n-type nitride semiconductor layer 604 where the source electrode 206, the drain electrode 207, and the gate electrode 608 are not provided, and also on the respective bottom surfaces and inner wall surfaces of the first and second trenches 610d and 610e.

The FET 6 according to the present embodiment can be fabricated in accordance with a method shown hereinbelow.

First, by using, e.g., a MOCVD method, the buffer layer 102, the first nitride semiconductor layer 103, the second nitride semiconductor layer 104, and the n-type nitride semiconductor layer 604 are epitaxially grown successively on the surface of the substrate 101. The n-type nitride semiconductor layer 604 used herein is made of, e.g., Si-doped GaN. The impurity concentration in the n-type nitride semiconductor layer 604 is preferably not less than $5 \times 10^{16}$ cm$^{-3}$ and not more than $5 \times 10^{19}$ cm$^{-3}$, and is, e.g., $1 \times 10^{18}$ cm$^{-3}$. The film thickness of the n-type nitride semiconductor layer 604 is preferably not less than 3 nm and not more than 200 nm, and is, e.g., 20 nm.

Next, by performing dry etching using, e.g., a Cl$_2$ gas with respect to the surface of the n-type nitride semiconductor layer 604, the concave portion 610a, a source-electrode hole 610b, a drain-electrode hole 610c, the first trench 610d, and the second trench 610e are formed in the surface of the n-type nitride semiconductor layer 604.

Subsequently, boron ions, e.g., are implanted to form the isolation regions 105.

Subsequently, by using, e.g., a plasma CVD method and a sputtering method, the insulating film 605 is formed on the upper surface of the n-type nitride semiconductor layer 604. At this time, the insulating film 605 is also formed on the respective bottom surfaces and inner wall surfaces of the first and second trenches 610d and 610e.

Subsequently, by using a dry etching method, the insulating film 605 is partly etched to form the respective electrode windows for the source electrode 206, the drain electrode 207, and the gate electrode 608.

Subsequently, by using, e.g., an electron beam deposition method and a lift-off method, the source electrode 206 and the drain electrode 207 are formed. Thereafter, a thermal treatment is performed to form ohmic contacts.

Then, by using, e.g., an electron beam deposition method and a lift-off method, the gate electrode 608 is buried in the concave portion 610a and provided on the upper surface of the n-type nitride semiconductor layer 604 so as to cover the opening of the concave portion 610a. In this manner, the FET 6 according to the present embodiment can be fabricated.

OTHER EMBODIMENTS

The present invention may also assume the structures shown below.

The concave portion is not limited to the configuration shown in FIG. 1 or the like and may also have another configuration such as a U-shaped configuration or a V-shaped configuration.

Each of the source electrode and the drain electrode may be provided on the upper surface of the semiconductor multilayer as shown in FIG. 1, or may be in contact with the first nitride semiconductor layer to reach the two-dimensional electron gas layer, as shown in FIG. 15 or the like.

At the upper surface of the semiconductor multilayer, the length of the portion of the gate electrode extended over the semiconductor multilayer may be either equal on each of the side with the source electrode and the side with the drain electrode as shown in FIG. 1, or larger on the side with the drain electrode than on the side with the source electrode, as shown in FIG. 15 or the like.

Each of the FETs according to the first to fifth and seventh embodiments may also comprise an etching stop layer.

In each of the first to third and fifth to seventh embodiments, the concave portion is formed by using the etching method, while the concave portion is formed by using a regrowth method in the fourth embodiment. However, a method for forming the concave portion is not particularly limited. In the fabrication of the FET according to the fourth embodiment, the concave portion may also be formed by using an etching method. In the fabrication of the FETs according to the first to third and fifth to seventh embodiments, the concave portions may also be each formed by using a regrowth method.

What is claimed is:

1. A semiconductor device comprising:
   a substrate;
   a semiconductor multilayer having a first nitride-based compound semiconductor layer provided over the substrate and a second nitride-based compound semiconductor layer provided over the first nitride-based compound semiconductor layer to have a band gap larger than that of the first nitride-based compound semiconductor layer;
   a source electrode and a drain electrode each provided to have at least a portion thereof in contact with the semiconductor multilayer,
   a concave portion provided on an upper surface of the semiconductor multilayer to be located between the source electrode and the drain electrode, and concaved in a thickness direction of the semiconductor multilayer;
   a gate electrode provided over the concave portion to cover an opening of the concave portion; and
   a p-type nitride-based compound semiconductor layer provided to cover the opening of the concave portion and to be located between the gate electrode and the semiconductor multilayer,
   wherein the p-type nitride-based compound semiconductor layer works as a part of a terminal for controlling a current between the source and the drain by applying a voltage, and
   a film thickness of a portion of the p-type nitride-based compound semiconductor layer located over a bottom surface of the concave portion is larger than a film thickness of a portion of the p-type nitride-based compound semiconductor layer located on the upper surface of the semiconductor multilayer.

2. A semiconductor device comprising:

a substrate;

a semiconductor multilayer having a first nitride-based compound semiconductor layer provided over the substrate and a second nitride-based compound semiconductor layer provided over the first nitride-based compound semiconductor layer to have a band gap larger than that of the first nitride-based compound semiconductor layer;

a source electrode and a drain electrode each provided to have at least a portion thereof in contact with the semiconductor multilayer;

a concave portion provided on an upper surface of the semiconductor multilayer to be located between the source electrode and the drain electrode, and concaved in a thickness direction of the semiconductor multilayer;

a gate electrode provided over the concave portion to cover an opening of the concave portion; and an insulating film in contact with a portion of the upper surface of the semiconductor multilayer and opened to expose the concave portion, wherein the gate electrode has a portion thereof provided over the insulating film.

3. The semiconductor device of claim 2, wherein a fourth insulating film is provided to be in contact with a bottom surface of the concave portion and located between the gate electrode and the insulating film.

4. A semiconductor device comprising:

a substrate;

a semiconductor multilayer having a first nitride-based compound semiconductor layer provided over the substrate and a second nitride-based compound semiconductor layer provided over the first nitride-based compound semiconductor layer to have a band gap larger than that of the first nitride-based compound semiconductor layer;

a source electrode and a drain electrode each provided to have at least a portion thereof in contact with the semiconductor multilayer;

a concave portion provided on an upper surface of the semiconductor multilayer to be located between the source electrode and the drain electrode, and concaved in a thickness direction of the semiconductor multilayer; and a gate electrode provided over the concave portion to cover an opening of the concave portion wherein the semiconductor multilayer further has an n-type nitride-based compound semiconductor layer provided as an uppermost layer over the second nitride-based compound semiconductor layer, and at least one of a portion of the n-type nitride-based compound semiconductor layer located between the gate electrode and the source electrode and a portion of the n-type nitride-based compound semiconductor layer located between the gate electrode and the drain electrode is removed.

* * * * *